(12) United States Patent
Park et al.

(10) Patent No.: US 9,112,015 B2
(45) Date of Patent: Aug. 18, 2015

(54) SEMICONDUCTOR DEVICES

(71) Applicant: Samsung Electronics Co., Ltd., Suwon-Si, Gyeonggi-Do (KR)

(72) Inventors: Keum-Seok Park, Gwangmyeong-si (KR); Jung-Ho Yoo, Gangnam-gu (KR); Woo-Bin Song, Hwaseong-si (KR); Byeong-Chan Lee, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 29 days.

(21) Appl. No.: 13/921,616

(22) Filed: Jun. 19, 2013

(65) Prior Publication Data

US 2014/0027824 A1    Jan. 30, 2014

(30) Foreign Application Priority Data

Jul. 30, 2012    (KR) ......................... 10-2012-0082905

(51) Int. Cl.
  *H01L 29/76*    (2006.01)
  *H01L 29/78*    (2006.01)
  *H01L 29/66*    (2006.01)
  *H01L 29/06*    (2006.01)
  *H01L 29/165*    (2006.01)
  *H01L 21/8238*    (2006.01)

(52) U.S. Cl.
  CPC ........ *H01L 29/78* (2013.01); *H01L 21/823814* (2013.01); *H01L 29/0684* (2013.01); *H01L 29/165* (2013.01); *H01L 29/6656* (2013.01); *H01L 29/66636* (2013.01); *H01L 29/7834* (2013.01); *H01L 29/7848* (2013.01)

(58) Field of Classification Search
  CPC ..................... H01L 29/66636; H01L 29/7834; H01L 29/0684

USPC .................. 257/377, 382, 385, 401, E29.121, 257/E29.122

See application file for complete search history.

(56) References Cited

U.S. PATENT DOCUMENTS

| | | | |
|---|---|---|---|
| 6,284,610 B1 * | 9/2001 | Cha et al. ....................... | 438/300 |
| 6,323,525 B1 * | 11/2001 | Noguchi et al. .............. | 257/385 |
| 6,580,134 B1 * | 6/2003 | Song et al. .................... | 257/384 |
| 6,780,691 B2 * | 8/2004 | Cha et al. ....................... | 438/161 |
| 7,566,599 B2 * | 7/2009 | Divakaruni et al. .......... | 438/151 |
| 7,812,394 B2 | 10/2010 | Murthy et al. | |

(Continued)

FOREIGN PATENT DOCUMENTS

| | | |
|---|---|---|
| JP | 6-61268 A | 3/1994 |
| KR | 10-0333727 B1 | 7/2000 |
| KR | 2000-0041382 A | 7/2000 |

*Primary Examiner* — Matthew E Warren
(74) *Attorney, Agent, or Firm* — Harness, Dickey & Pierce, P.L.C.

(57) ABSTRACT

In a semiconductor device and a method of manufacturing the same, the semiconductor device includes a gate structure crossing an active region of a silicon substrate. Spacers are provided on both sides of the gate structure, respectively. Silicon patterns fill up recessed portions of the silicon substrate and on both sides of the spacers and has a shape protruding higher than a bottom surface of the gate structure, a lower edge of the protruded portion partially makes contact with a top surface of the isolation region, a first side and a second side of each of the silicon patterns, which are opposite to each other in a channel width direction in the gate structure, are inclined toward an inside of the active region. A highly doped impurity region is provided in the silicon patterns and doped with an N type impurity. The semiconductor device represents superior threshold voltage characteristics.

13 Claims, 17 Drawing Sheets

(56) References Cited

U.S. PATENT DOCUMENTS

| | | |
|---|---|---|
| 7,906,809 B2 | 3/2011 | Aiso |
| 8,084,309 B2 * | 12/2011 | Cheng et al. .................. 438/163 |
| 2005/0079691 A1 | 4/2005 | Kim et al. |
| 2005/0095820 A1 | 5/2005 | van Bentum et al. |
| 2006/0008961 A1 | 1/2006 | Lee et al. |
| 2006/0134872 A1 | 6/2006 | Hattendorf et al. |
| 2006/0138398 A1 * | 6/2006 | Shimamune et al. ........... 257/19 |
| 2007/0072399 A1 | 3/2007 | Kim et al. |
| 2008/0105899 A1 | 5/2008 | Kim et al. |
| 2010/0041201 A1 | 2/2010 | Son et al. |

* cited by examiner

SEMICONDUCTOR DEVICES

CROSS-REFERENCE TO RELATED APPLICATION

This application claims priority under 35 USC §119 to Korean Patent Application No. 10-2012-0082905 filed on Jul. 30, 2012, in the Korean Intellectual Property Office (KIPO), the entire disclosure of which is incorporated herein by reference.

BACKGROUND

1. Field

Example embodiments relate to semiconductor devices and/or methods of manufacturing the same. More particularly, example embodiments relate to semiconductor devices including an NMOS transistor and methods of manufacturing the same.

2. Description of the Related Art

Transistors having high integration degree with high performance have been developed. In the case of a planar transistor, research has been performed on a method of considerably reducing a junction depth of source/drain and forming a gate insulating layer having a high dielectric constant.

SUMMARY

Some example embodiments provide a semiconductor device, which is highly integrated and exhibits superior electrical characteristics, and/or a method of manufacturing the same.

According to an example embodiment, there is provided a semiconductor device. The semiconductor device includes a silicon substrate including an isolation region and an active region, the active region including a main surface portion and recessed portions. A gate structure on the active region of the silicon substrate includes a gate insulating layer and a gate electrode, the gate structure being between the recessed portions. Spacers are on both sides of the gate structure. Silicon patterns are on the recessed portions of the active region and on sides of the spacers, each of the silicon patterns including a first portion in one of the recessed portions and a second portion disposed higher than a bottom surface of the gate structure, a lower edge of the second portion configured to partially contact a top surface of the isolation region, a first side and a second side of each of the silicon patterns being inclined toward an inside of the active region in an upward direction and the first side and the second side are opposite to each other in a channel width direction of the gate structure. Highly doped impurity region are provided in the silicon patterns with an N type impurity.

In an example embodiment, a portion of the lower edge of the second portion of the silicon patterns, which contact with the top surface of the isolation region, may have a width in a range of about 5 nm to about 15 nm.

In an example embodiment, a first angle between the first side and a top flat surface of the silicon substrate and a second angle between the second side and the top flat surface of the silicon substrate may be in a range of about 50° to about 85°.

In an example embodiment, a top surface of each of the silicon patterns may be flat, and an upper width of each of the silicon patterns may be equal to or greater than about 70% of an upper width of the first portion of each of the silicon patterns located in the recessed portions.

In an example embodiment, the semiconductor device may further include wing spacers configured to contact a top surface of each of the silicon patterns and disposed on a sidewall of the spacers.

According to an example embodiment, there is provided a method of manufacturing a semiconductor device. In the method, an isolation pattern is formed on a silicon substrate to define an isolation region and an active region. A gate structure formed across the active region of the silicon substrate and including a gate insulating layer and a gate electrode. Spacers are formed on sides of the gate structure. The active region of the silicon substrate is etched on sides of the spacers to form recessed portions and a main surface portion. A first preliminary silicon pattern is formed and configured to fill insides of the recessed portions and configured to protrude the main surface portion to form sidewall facets through a first selective epitaxial growth process in which a first N type impurity having a first doping concentration is doped in-situ under a first pressure. Silicon patterns are formed by forming second preliminary silicon pattern on the first preliminary silicon patterns through a second selective epitaxial growth process in which a second N type impurity having a second impurity concentration lower than the impurity doping concentration is doped in-situ under a second pressure higher than the first pressure. Highly doped impurity regions are formed by doping an N type impurity into the silicon patterns.

In an example embodiment, a height of a portion of the first preliminary silicon patterns protruding above the main surface portion of the silicon substrate may be lower than a height of the second preliminary silicon patterns.

In an example embodiment, a height of a portion of the first preliminary silicon patterns protruding above the main surface portion of the silicon substrate may be in a range of about 1 nm to about 10 nm.

In an example embodiment, the first and second N type impurities doped in the first and second selective epitaxial growth processes may include phosphorus. An impurity concentration of the phosphorus in the first selective epitaxial growth process may be in a range of about $1E19\ cm^{-3}$ to about $9E19\ cm^{-3}$.

In an example embodiment, the first pressure may be in a range of about 10 Torr to about 70 Torr, and the second pressure may be in a range of about 100 Torr to about 200 Torr.

In an example embodiment, the second pressure may be at least three times greater than the first pressure.

In an example embodiment, in the second selective epitaxial growth process, a first growth rate from a top surface of the first preliminary silicon pattern may be at least three times greater than a second growth rate from the sidewall facets of the first preliminary silicon pattern.

In an example embodiment, in a second selective epitaxial growth process, a width of a portion of a silicon layer laterally grown from the sidewall facet of the first preliminary silicon pattern may be in a range of about 5 nm to about 15 nm.

In an example embodiment, the method may further include forming wing spacers on sidewalls of the gate spacers, the wing spacers configured to contact a top surface of each of the silicon patterns.

According to an example embodiment, there is provided another semiconductor device. The semiconductor device includes a silicon substrate including an isolation region and an active region, the active region including a main surface portion and at least one recessed portion. A gate structure on the active region of the silicon substrate includes a gate insulating layer and a gate electrode. A spacer is on at least one side of the gate structure. A silicon pattern is on the at least one recessed portion of the active region and one a side of the spacer, the silicon pattern including a first portion in the at least one recessed portion and a second portion disposed higher than a bottom surface of the gate structure. A highly doped impurity region is provided in the silicon pattern.

In an example embodiment, a lower edge of the second portion is configured to partially contact a top surface of the isolation region.

In an example embodiment, the silicon pattern includes a first side and a second side opposite to each other in a channel width direction of the gate structure, and inclined toward an inside of the active region in an upward direction.

In an example embodiment, the highly doped impurity region in the silicon pattern includes an N type impurity.

In an example embodiment, the spacer includes a first layer and a second layer, and the first and second layers are on a side of the gate structure.

In an example embodiment, the silicon pattern includes a first side and a second side opposite to each other in a channel width direction of the gate structure. A first angle between the first side and a top flat surface of the silicon substrate and a second angle between the second side and the top flat surface of the silicon substrate are in a range of about 50° to about 85°.

In an example embodiment, there is provided a second active region in the silicon substrate, the second active region including a second at least one recessed portion. A second gate structure on the second active region of the silicon substrate includes a second gate insulating layer and a second gate electrode. A second spacer is on at least one side of the second gate structure. A second silicon pattern is on the second at least one recessed portion of the second active region and on a side of the second spacer, the second silicon pattern including a first portion in the second at least one recessed portion and a second portion disposed higher than a bottom surface of the gate structure. A second highly doped impurity region is provided in the second silicon pattern, and includes a P type impurity In accordance with an example embodiment, because an angle between a sidewall of a silicon pattern included in the semiconductor device and a main surface portion of a silicon substrate is in the range of about 50° to about 85°, a sidewall gradient of each of the silicon patterns is steep. Accordingly, projected ranges of impurities in the silicon patterns are uniform. Therefore, a variation of a threshold voltage in the semiconductor device can be reduced and the semiconductor device can exhibit superior electrical characteristics.

BRIEF DESCRIPTION OF THE DRAWINGS

Example embodiments will be more clearly understood from the following detailed description taken in conjunction with the accompanying drawings. FIGS. 1 to 11G represent non-limiting, example embodiments as described herein.

FIG. 1 is a plan view illustrating an NMOS transistor in accordance with an example embodiment;

FIG. 5 is a sectional view illustrating a step of forming a silicon pattern;

FIG. 10 is a sectional view illustrating a CMOS FET in accordance with an example embodiment; and FIGS. 11A to 11G are sectional views illustrating a method of manufacturing a CMOS FET shown in FIG. 10.

Figure 1:
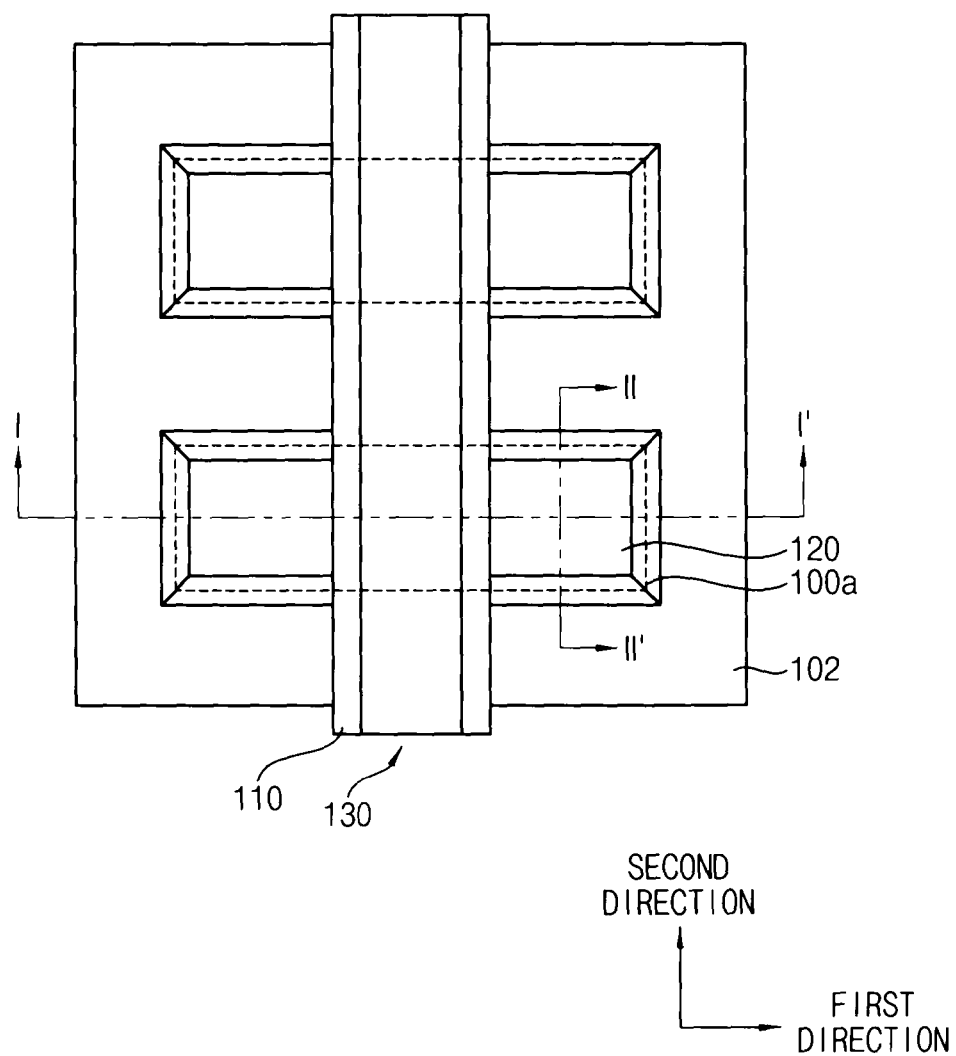

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF THE EMBODIMENTS

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include variations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be described in detail with reference to the accompanying drawings.

Figure 2A:
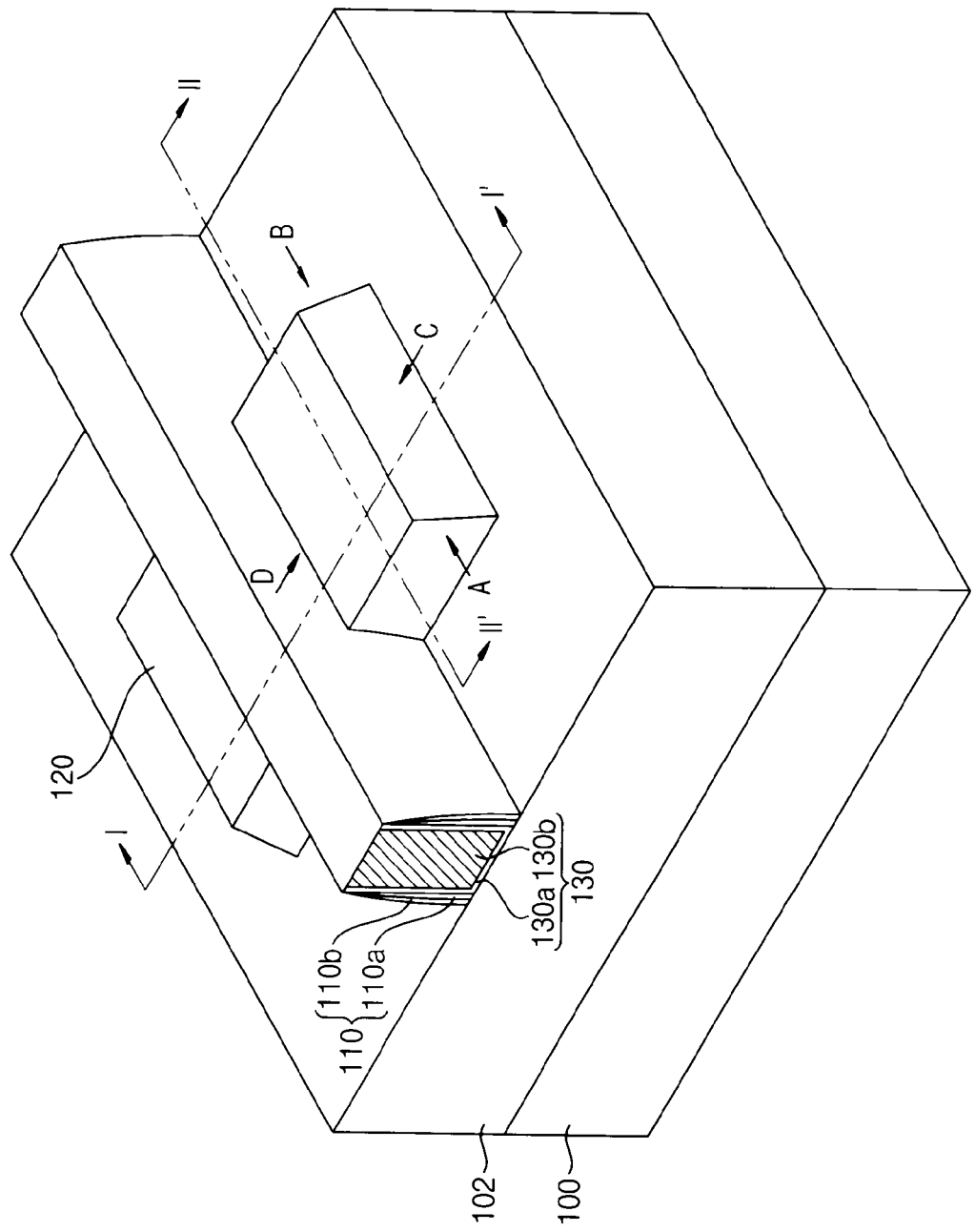
FIG. 2A is a perspective view illustrating an NMOS transistor in accordance with an example embodiment.
Figure 2B:
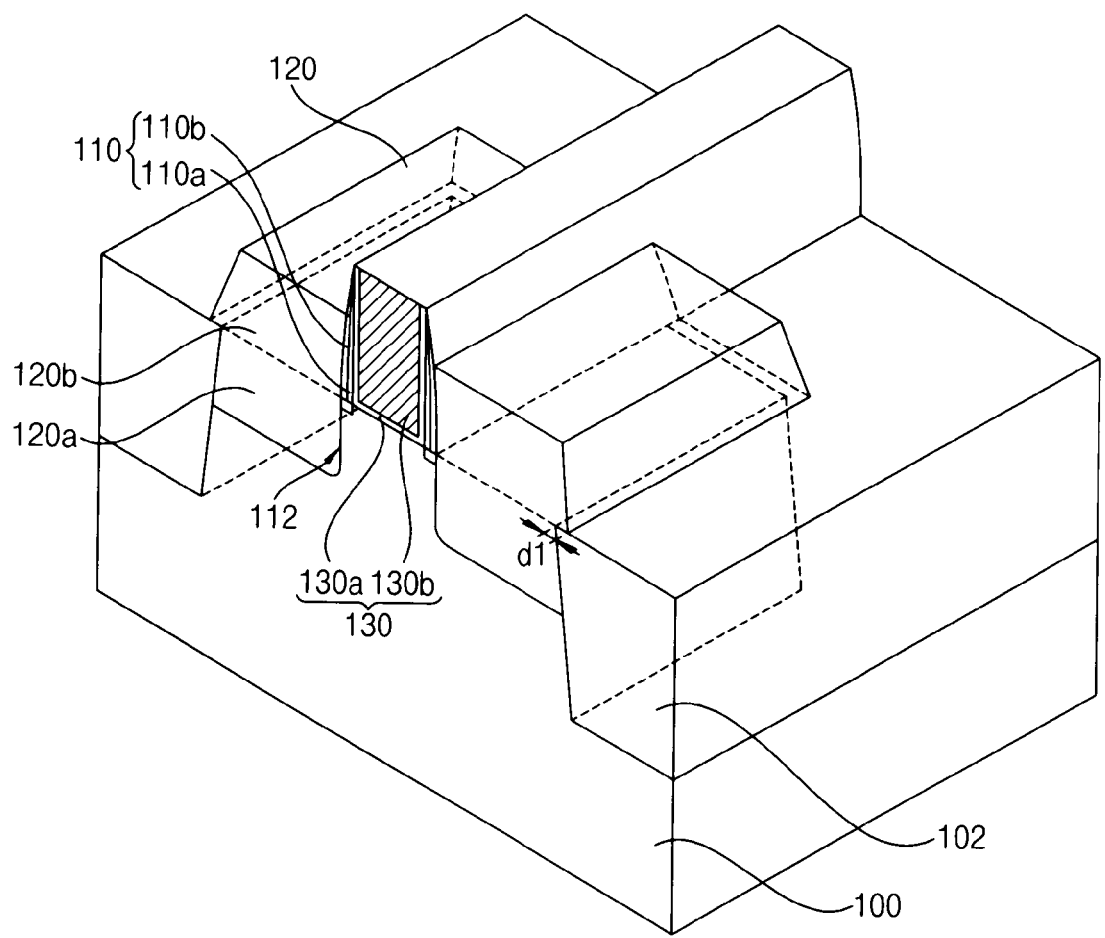
FIG. 2B is a perspective view taken along line I-I' of FIGS. 1 and 2A.
Figure 2C:
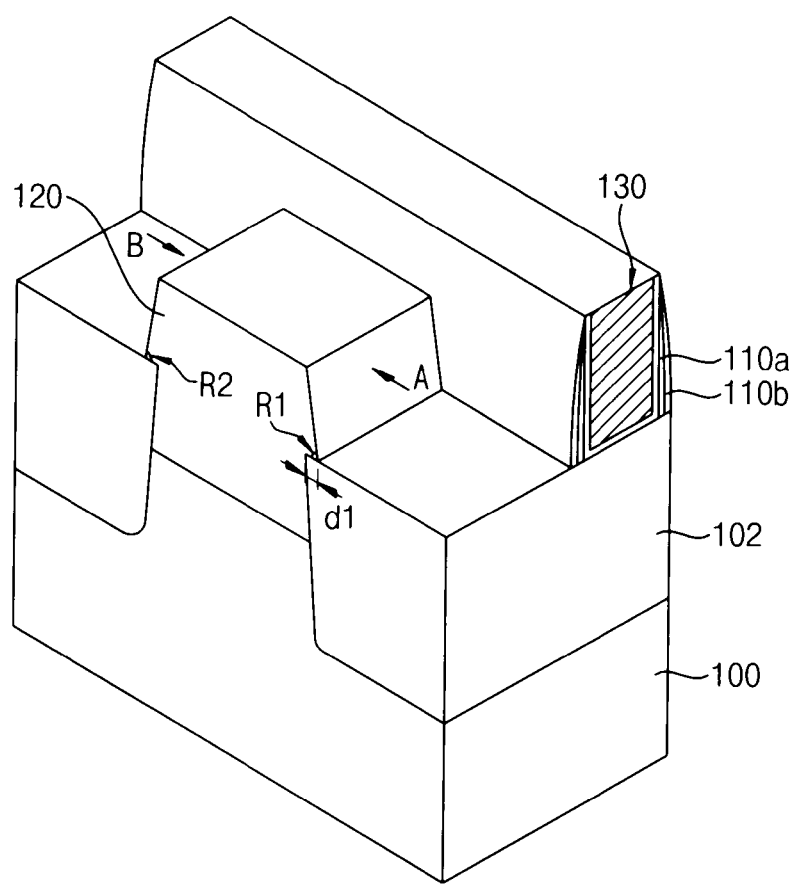
FIG. 2C is a perspective view taken along line II-II' of FIG. 2A.
Figure 3A:
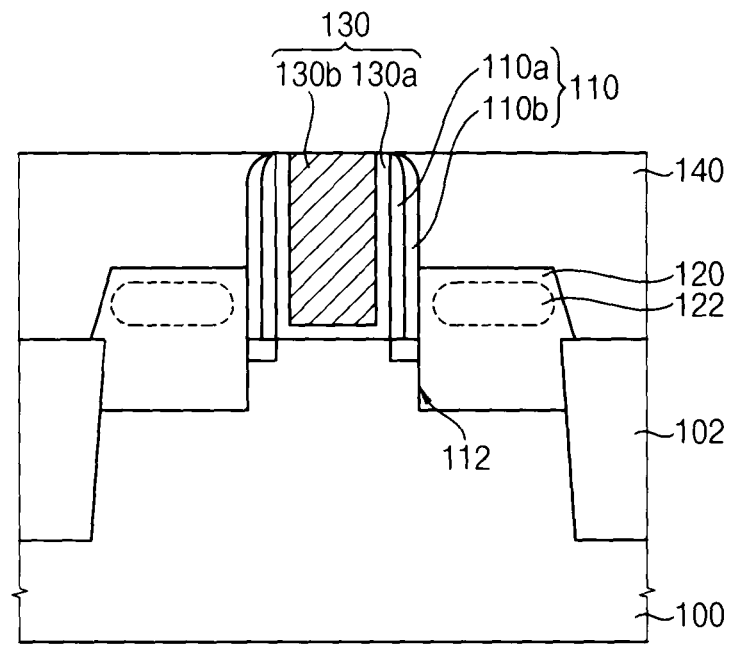
FIG. 3A is a sectional view taken along line I-I' of FIGS. 1 and 2A.
Figure 3B:
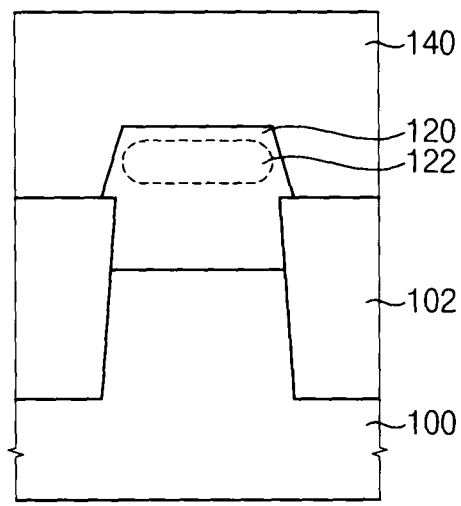
FIG. 3B is a sectional view taken along line II-II' of FIG. 2A.

FIG. 1 is a plan view illustrating an NMOS transistor in accordance with an example embodiment. FIG. 2A is a perspective view illustrating an NMOS transistor in accordance with an example embodiment. FIG. 2B is a partial perspective view of the NMOS transistor cut along line I-I' of FIGS. 1 and 2A. FIG. 2C is a partial perspective view of the NMOS transistor cut along line II-II' of FIG. 2A. FIG. 3A is a sectional view taken along line I-I' of FIGS. 1 and 2A. FIG. 3B is a sectional view taken along line II-II' of FIG. 2A.

Hereinafter, an example embodiment will be described with reference to FIGS. 1 to 3B.

An NMOS transistor is formed on a silicon substrate 100 that has an active region and a field region. The NMOS transistor includes a gate structure 130, gate spacers 110, and silicon patterns 120 having a highly doped impurity region 122. The silicon patterns 120 are provided on recessed portions of the silicon substrate. Each highly doped impurity region 122 included in the silicon patterns 120 may become an elevated source/drain region.

The silicon substrate 100 may be a single crystal silicon substrate or an SOI (Silicon on insulator) substrate. An active region 100a and a field region may be defined on the silicon substrate 100. An isolation layer pattern 102 formed by an STI (shallow trench isolation) process may be provided on the field region of the silicon substrate 100. The active region 100a may have an island shape surrounded by the field region. For example, a top surface of the active region 100a may have a rectangular shape having lengths in a first direction which is a channel length direction, and a second direction which is the channel width direction. The active region 100a may include recessed portions and a main surface portion in the silicon substrate. The main surface portion may have a flat top surface.

The gate structure 130 faces a channel region of the silicon substrate 100. That is, the gate structure 130 has a linear shape extending in the second direction through the active region 100a.

The gate structure 130 has a stacked structure having a gate insulating layer 130a and a gate electrode 130b. The gate insulating layer 130a may, for example, include a silicon oxide layer or a metal oxide layer having a high dielectric constant. The gate electrode 130b may include polysilicon or a metallic material, for example. The gate structure 130 may be formed on the main surface portion of the substrate. The gate structure 130 may be formed between the recessed portions of the silicon substrate 100.

When the gate structure 130 has a stack structure of a metal oxide layer having a high dielectric constant and a metallic material, the gate structure 130 may exhibit superior electrical characteristics. Accordingly, the example embodiment will be made on the assumption that the gate structure 130 has the stack structure of the metal oxide layer having the high dielectric constant and the metallic material. Examples of materials used for the metal oxide layer may include hafnium oxide or zirconium oxide. The above materials may be used alone or in a combination thereof. Examples of materials used for the metallic material may include iridium (Ir), niobium (Nb), platinum (Pt), rhenium (Re), rhodium (Rh), ruthenium (Ru), tantalum (Ta), tantalum nitride (TaN), tantalum silicon nitride (TaSiN), titanium (Ti), titanium nitride (TiN), tungsten (W), vanadium (V), etc. The above materials may be used alone or in a combination thereof. However, the example embodiments are not limited thereto.

The gate spacers 110 are provided on sidewalls of the gate structure 130. The gate spacers 110 may be formed of a single insulating material. According to an example embodiment, as shown in the drawing, the gate spacers 110 may include at least two laterally laminated insulating materials. For example, the gate spacers 110 may be formed by horizontally laminating silicon oxide 110a and silicon nitride 110b.

A source/drain extension region doped with an N type impurity having relatively low impurity concentration may be provided on a substrate below the gate spacers 110. The source/drain extension region may have an impurity concentration lower than that of the highly doped impurity region 122.

The recessed portions 112 are provided in a portion of the silicon substrate 100 and are defined by an outer side of the gate spacers 110 and an isolation pattern 102. The recessed portions 112 may have a depth in a range of about 10 nm to about 40 nm, for example, from the main surface portion of the silicon substrate 100. However, the depth of the recessed portions 112 is not limited to the above.

The silicon patterns 120 fill up an inside of the recessed portions 112 and may protrude from the main surface of the silicon substrate 100. In each of the silicon patterns 120, a portion provided in each of the recessed portions 112 is a first portion 120a and a portion protruding from the main surface portion of the silicon substrate 100 is a second portion 120b.

Each of the silicon patterns 120 of the second portion 120b may include first, second, and third sides A, B, C adjacent and/or abutting to the isolation layer pattern 102, a fourth side D adjacent and/or abutting to the gate spacers 110 and top and bottom surfaces of the active region. Hereinafter, a side opposite the fourth side D in a first direction refers to a third side C. Sides opposite each other in a second direction refer to first and second sides A and B, respectively.

First, the first and second sides A and B in opposition to each other will be described with reference to FIGS. 2C and 3B.

In FIGS. 2C and 3B, a part of a bottom portion of the second portion 120b in each of the silicon patterns 120 partially makes contact with a top surface of an outer peripheral portion of the isolation pattern 102. That is, the bottom portion of the second portion 120b of each of the silicon patterns 120 has a shape that laterally extends to a portion of the isolation layer pattern 102 in each of the recessed portions 112. Since the lower portion of the second portion 120b of each of the silicon patterns 120 are wider than an upper portion of the first portion 120a of each of the silicon patterns 120, a lateral side of the second portion 120b may be bent or turned at a boundary between the first and second portions 120a and 120b. However, a width d1 of the second portion 120b of each of the silicon patterns 120 contacting the top surface of an edge of the isolation layer pattern 102 may be narrow and in a range of about 5 nm to about 15 nm, according to an example embodiment. A width d1 is preferably less than 10 nm according to an example embodiment. As described above, because the width d1 of the portion extending to the isolation pattern 102 may be narrow, a bridge defect caused by contact between adjacent silicon patterns may be reduced.

The first, second, and third sides A, B, and C of each of the silicon patterns 120 protrude from the main surface portion of the silicon substrate 100 and may be inclined or sloped toward the active region 100a in an upward direction.

As shown in FIGS. 2A and 3B, a first angle R1 between the first side A of each of the silicon patterns 120 and the main surface portion of the substrate may be substantially the same as a second angle R2 between the second side B and the main surface portion of the substrate 100, according to an example embodiment. A difference between the first and second angles R1 and R2 may be 10° or less.

If the first and second angles R1 and R2 are less than 50°, a side gradient of the silicon patterns 120 may be too low such that a doping depth of the highly doped impurity region 122 formed in the silicon patterns 120 may become non-uniform. Although the doping depth of the highly doped impurity region 122 may become more uniform as the first and second angles reach 90°, it may not be substantially easier to form the first and second angles R1 and R2 equal to or greater than 85°. Accordingly, the first and second angles R1 and R2 may be in the range of between 50° and 85°, according to an example embodiment. The first and second angles R1 and R2 are preferably set to 55° or above such that a doping depth of the highly doped impurity region 122 formed in the silicon patterns 120 can be uniform.

Hereinafter, the third and fourth sides C and D opposite to each other will be described with reference to FIGS. 2B and 3A which are a partial perspective view and a sectional view taken in the second direction, respectively.

As shown in FIGS. 2B and 3A, the fourth side D may make contact with one of the gate spacers 110. Accordingly, the gate spacers 110 may not include insulating wing spacers.

The third side C may have a shape similar to that of each of the first and second sides A and B. That is, the third side may be inclined or sloped toward the active region 100a. A third angle between the third side C and the main surface portion of the substrate 100 may be in the range of about 50° to about 85° according to an example embodiment. However, a portion of the third side C is opposite the channel region of the NMOS transistor and may not be directly related to operational characteristics of the NMOS transistor. For this reason, a shape of a portion of the third side C may not be limited to the above.

A top surface of each of the silicon patterns 120 may be a plane substantially parallel to the main surface portion of the substrate 100. That is, the top surface of each of the silicon patterns 120 has a flat surface.

Referring back to FIGS. 2C and 3B, since the first and second angles R1 and R2 are in the range of about 50° to about 85°, a side gradient or slope of a protrusion portion of the silicon patterns 120 may be steep. Thus, under the same height condition of the silicon patterns 120, a top surface of the silicon patterns 120 may have a wider width or a wider area as compared with an example embodiment where a side gradient of the silicon patterns 120 is gentle or relatively less steep. For instance, an upper width or upper area of the second portion 120b of the silicon patterns 120 may be equal to or greater than 70% of an upper width or upper area of the first portion 120a of the silicon patterns 120.

Meanwhile, the second portion 120b of the silicon patterns 120 may have a height in a range of about 20 nm to about 50 nm according to an example embodiment. However, the height of the second portion 120b of one of the silicon patterns 120b is not limited to the above, but may be changed according to a degree of integration of the NMOS transistor.

The highly doped impurity region 122 is provided in the silicon patterns 120 as elevated source/drain regions. An N type impurity may be doped in the highly doped impurity region 122 and the N type impurity may include phosphorus (P), for example. The highly doped impurity region 122 may have a projected range Rp, which is a doping depth from a top surface of each of the silicon patterns 120.

The highly doped impurity region 122 may be formed by implanting an N type impurity into an upper portion of the silicon patterns 120. Accordingly, the top surface and side gradient of the silicon patterns 120 may affect the projected range Rp of the highly doped impurity region 122.

For example, when the side gradient or slope of the silicon patterns 120 is gentler as compared with the example embodiment, the projected range Rp of an impurity implanted from the inclined side may become very deep. In contrast, the projected range Rp of an impurity implanted from a flat surface of a top surface of the silicon patterns is relatively shallow according to an example embodiment. As described above, when the side gradient of the silicon patterns is gentle, a variation of a projected range Rp of the highly doped impurity region 122 in the silicon patterns is undesirably and extremely increased, which is disadvantageous.

However, according to an example embodiment, an angle between each of first, second and third sides of the silicon patterns 120 and the main surface portion of the substrate is high in the range of about 50° to about 85°. Accordingly, the impurity is rarely implanted through an inclined side, and may be implanted from the top surface of each of the silicon patterns 120. For this reason, a difference of an impurity projected range between an impurity region provided below the first to third sides and an impurity region provided below the top surface is not significant. That is, a difference of a height of a bottom surface of the highly doped impurity region 122 is not significant. Accordingly, the highly doped impurity region 122 may have a uniform doping depth.

If the variation of the projected range Rp of the highly doped impurity region 122 is increased, a leakage current path may be formed in a portion of a deep project range of the impurity, and accordingly, a threshold voltage of the NMOS transistor may be reduced. Particularly, when a channel width of a gate structure of an NMOS transistor is narrow at the level of several tens of nm, a threshold voltage characteristic may significantly vary according to a variation of a projected range of an impurity in sides of the silicon patterns aligned in the second direction. However, according to an example embodiment, because a variation of the projected range Rp of the highly doped impurity region 122 is considerably reduced, the threshold voltage characteristic does not vary according to the variation of the projected range Rp of the highly doped impurity region 122.

A lowly doped impurity region is provided below the highly doped impurity region 122 in each of the silicon patterns 120.

As described above, the angles between each of first, second, and third sides A, B, and C of the silicon patterns 120 and the main surface portion of the silicon substrate 100 are high in the range of about 50° to about 85°, and the top surface of each of the silicon patterns 120 has a relatively large area. Due to this, projected ranges Rp are uniform in each of the silicon patterns. Accordingly, a variation of a threshold voltage in the MOS transistor is reduced, and the MOS transistor may exhibit superior electrical characteristics.

FIGS. 4A to 4E are sectional views illustrating a method of manufacturing an NMOS transistor shown in FIGS. 1 to 3B according to an example embodiment. FIG. 5 is a sectional view illustrating a step of forming silicon patterns 120.

Figure 4A:
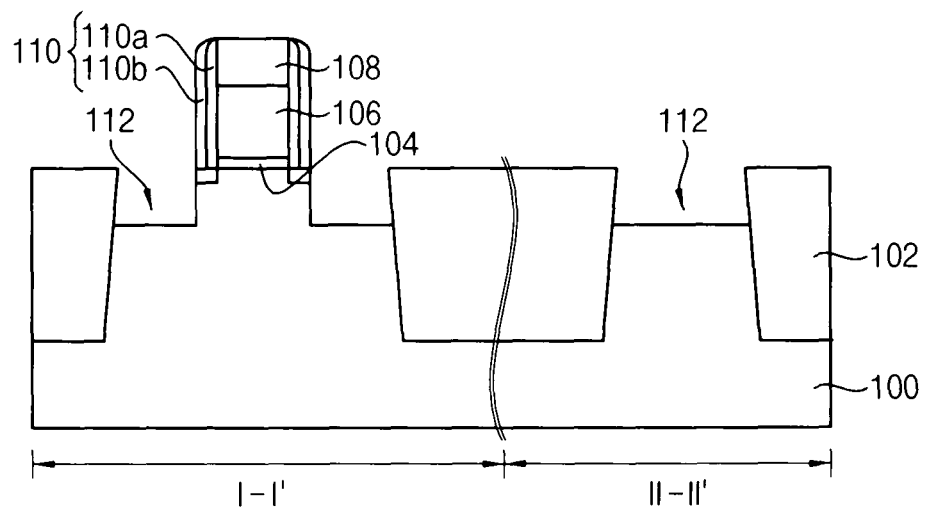
FIGS. 4A to 4E are sectional views illustrating a method of manufacturing an NMOS transistor shown in FIGS. 1 to 3B.
Figure 5:
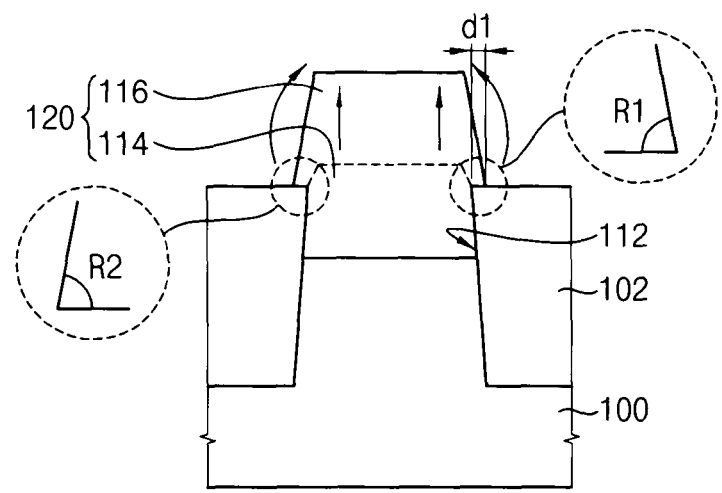

Referring to FIG. 4A, isolation patterns 102 are formed on the silicon substrate 100 corresponding to a field region by performing an isolation process on the silicon substrate 100. The isolation process may include a shallow trench isolation process (STI).

A sacrificial gate insulating layer 104, a sacrificial gate electrode layer 106 and a hard mask layer 108 are sequentially formed on the silicon substrate 100. A sacrificial gate structure, in which the sacrificial gate insulating layer 104, a sacrificial gate electrode 106 and a hard mask 108 are laminated, is formed by patterning the sacrificial gate insulating layer 104, the sacrificial gate electrode layer 106 and the hard mask layer 108.

A first spacer layer is formed along a surface of the sacrificial gate structure and a surface of the silicon substrate 100. An N type impurity of low impurity concentration may be doped under the surface of the silicon substrate 100 on which the first spacer layer is formed. After that, a second spacer layer is formed on the first spacer layer, and the first and second spacer layers are anisotropically etched. Accordingly, gate spacers 110 are formed on sidewalls of the gate structure.

Although, according to an example embodiment, each gate spacer 110 includes first and second spacers 110a and 110b, the example embodiments are not limited to the above. That is, the gate spacers 110 may be formed by one insulating material layer according to an example embodiment. The gate spacers 110 may have a shape in which at least two insulating material layers are horizontally laminated.

Recessed portions 112 are formed by etching a surface of the silicon substrate 100 of sides of the gate spacers 110. The etching process may include an anisotropic etching process or anisotropic etching process. According to an example embodiment, the recessed portions 112 formed by the etching process may have a depth in the range of about 10 nm to about 40 nm. Example embodiments are not limited to the above.

Figure 4B:
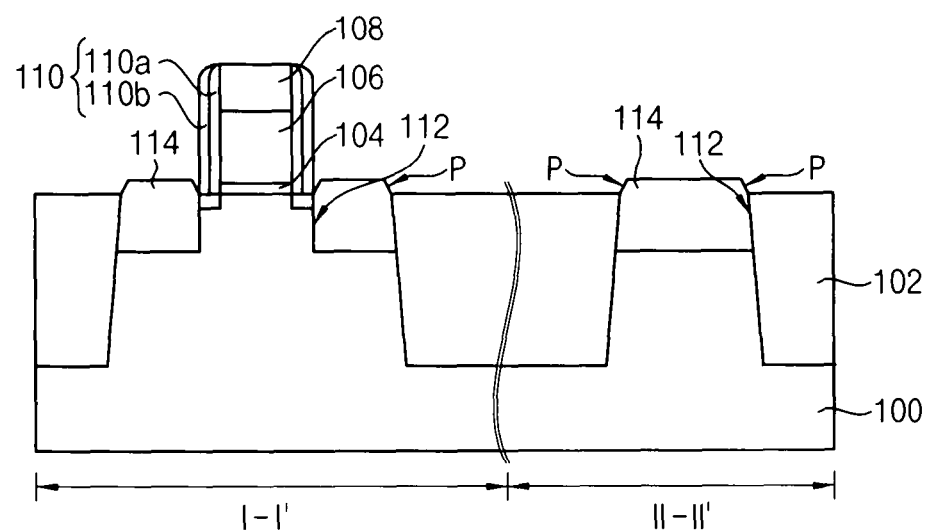

Referring to FIG. 4B, a portion of silicon pattern 120 is excessively grown higher than the main surface portion of the silicon substrate 100 while filling up the inside of the recessed portions 112 by performing a first selective epitaxial growth process. Through the first selective epitaxial growth process, first preliminary silicon patterns 114 protrude from the recessed portions 112. A facet P is formed on the first preliminary silicon patterns 114 at an edge of a portion that is located higher than the main surface portion of the silicon substrate 100.

An N type impurity is implanted in-situ by performing a first selective epitaxial growth process. According to an example embodiment, the implanted N type impurity may be phosphorus (P), for example. The phosphorus (P) may have an impurity concentration in a range of about $1E19$ cm$^{-3}$ to about $9E19$ cm$^{-3}$, for example. According to an example embodiment, it is preferable that the phosphorus (P) may have an impurity concentration of about $6E19$ cm$^{-3}$. Pressure in a process chamber may be in a range of about 10 Torr to about 70 Torr, for example, and a process temperature may be about 700° C. or less when performing the first selective epitaxial growth process.

A growth rate of the silicon layer may be adjusted, for example, by implanting an N type impurity during the first selective epitaxial growth process. That is, if the N type impurity is implanted, the growth rate of the silicon layer may be higher as compared with a case where the N type impurity is not implanted. Thus, the temperature may be reduced during the first selective epitaxial growth process to the level of about 700° C. or less. A lowly-doped impurity region may be prepared in the silicon layer. As described above, when the phosphorus (P) is doped in the range of about 1E19 cm-3 to about 9E19 cm-3, silicon may be stably grown.

The first preliminary silicon patterns 114 may be formed by growing silicon to the extent that the facet P is formed at a side of a portion that is located higher than the main surface portion of the silicon substrate 100. The main surface portion of the silicon substrate 100 becomes a (111) plane, and the facet P of the silicon substrate 100 becomes a (111) plane. However, even if silicon protrudes from the main surface portion of the silicon substrate 100 by several nm through the growth process, the facet P may be formed at a protruded side of the first preliminary silicon patterns 114. For example, a first epitaxial growth process may be performed such that the facet P protrudes from the main surface portion of the silicon substrate 100 by about 1 nm to about 10 nm.

If the pressure in the process chamber is higher than 70 Torr during the first selective epitaxial growth process, a silicon layer may be rapidly grown perpendicularly and laterally to the main surface portion of the substrate 100. For this reason, the facet P may be rarely formed at the side of the first preliminary silicon patterns, which is not advantageous. Therefore, as described above, the pressure in the process chamber may be set in the range of about 10 Torr to about 70 Torr. If, according to an example embodiment, the pressure in the process chamber is in the range of about 10 Torr to about 70 Torr, a silicon layer is rarely grown in the lateral direction, but the facet P is formed. That is, an outer peripheral portion of the first preliminary pattern 114 may not be provided on the isolation pattern 102.

Figure 4C:
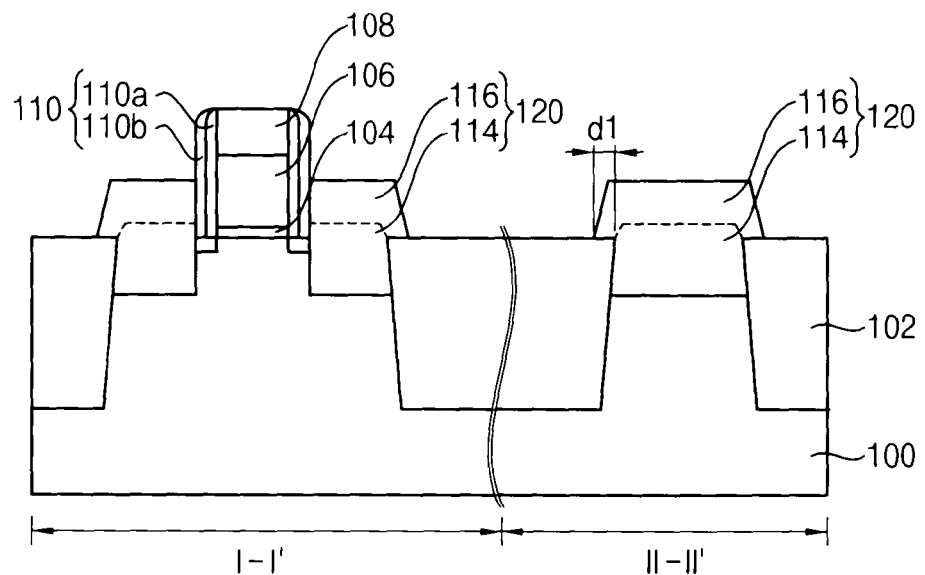

Referring to FIGS. 4C and 5, second preliminary silicon patterns 116 are formed on the first preliminary silicon patterns 114 by performing a second selective epitaxial growth process. Accordingly, each of the silicon patterns 120, which include the first and second preliminary silicon patterns 114 and 116, can be formed.

According to an example embodiment, a second selective epitaxial growth process may be performed in the same process chamber as that of the first selective epitaxial growth process under the different process conditions.

When the second selective epitaxial growth process is performed, the N type impurity is implanted with an impurity concentration lower than that of the N type impurity for the first selective epitaxial growth process. According to an example embodiment, the implanted N type impurity may be phosphorus (P). Pressure in the process chamber during the second selective epitaxial growth process is higher than that during the first selective epitaxial growth process, for example.

In detail, when the first preliminary silicon patterns 114 are formed to a target height, the pressure in the process chamber is increased. The pressure in the process chamber may be increased three times greater than the pressure which is set when the first preliminary silicon patterns 114 are formed, for example. According to an example embodiment, the pressure may be increased three times to two hundred times. According to some example embodiments, the pressure in the chamber may be in the range of about 100 Torr to about 200 Torr. An impurity concentration of an N type impurity implanted in-situ may be reduced as compared with a case where the first preliminary silicon patterns 114 are formed. For example, an impurity concentration of phosphorus (P) may be controlled as to lower than $6E19$ $cm^{-3}$; In an example embodiment, the process chamber may be maintained at the same temperature as that of the first selective epitaxial growth process.

If, in an example embodiment, the pressure in the process chamber is increased to the range of about 100 Torr to about 200 Torr, a first growth rate of a silicon on a (100) plane, which is a top flat surface in the first preliminary silicon patterns 114, is several times higher than a second growth rate of the silicon on a (111) plane which is the facet P. Accordingly, a silicon layer may be very slowly grown on a side of each of the first preliminary silicon patterns 114, and may be rapidly grown on a top surface of each of the first preliminary silicon patterns 114. As a result, the gradient of first and second sides of the prepared silicon patterns becomes very steep. A growth of the silicon on the sides of the first preliminary silicon patterns 114 may be suppressed so that a width d1 of the second portion 120 of the silicon patterns 120 making contact with a top surface of an edge of the isolation layer pattern 102 becomes very narrow in the range of about 5 nm to about 15 nm. The fourth side is configured to make contact with each of the gate spacers 110.

In addition, in the second selective epitaxial process, an impurity concentration of the phosphorus (P) may be reduced so that migration of the silicon is increased. That is, as shown in FIG. 5, silicon of a surface portion of the substrate 100 migrates to an upper portion so that a top surface of each of the silicon patterns 120 is planarized and an area of the tope surface of each of the silicon patterns 120 is increased, and thus, the gradient of the first and second sides may be relatively steep.

The second preliminary silicon patterns 116 may have a height greater than a height of the first preliminary silicon patterns 114 and may protrude higher than the main surface portion of the substrate 100. For instance, the second preliminary silicon patterns 116 may have a height greater than twice a height of the first preliminary silicon patterns 114 protruding higher than the main surface portion of the substrate 100. In an example embodiment where each of the silicon patterns 120, in which the first and second preliminary silicon pattern 114 and 116 are laminated, a second portion located higher than the main surface of the substrate 100 may have a height in the range of about 20 nm to about 50 nm.

The silicon patterns 120 formed by performing the process as describe above may have a similar shape as the shape described with reference to FIGS. 1 to 3B.

That is, a bottom surface of the second portion 120b of the silicon patterns 120 may have a shape laterally extending to a portion of the isolation pattern 102, and the second portion 120b of the silicon patterns 120 that makes contact with the top surface of an edge of the isolation layer pattern 102 may be in the range of about 5 nm to about 15 nm, according to an example embodiment. A first angle between the first side and the main surface portion of the substrate 100 and a second angle between the second side and the main surface portion of the substrate 100 may be in the range of about 50° to about 85°, respectively. The top surface of each of the silicon patterns 120 has a plane substantially parallel to the main surface portion of the substrate 100. According to an example embodiment, an upper width of the second portion 120b of the silicon patterns 120 may be equal to or greater than about 70% of an upper width of the first portion 120a of the silicon patterns 120.

Figure 4D:
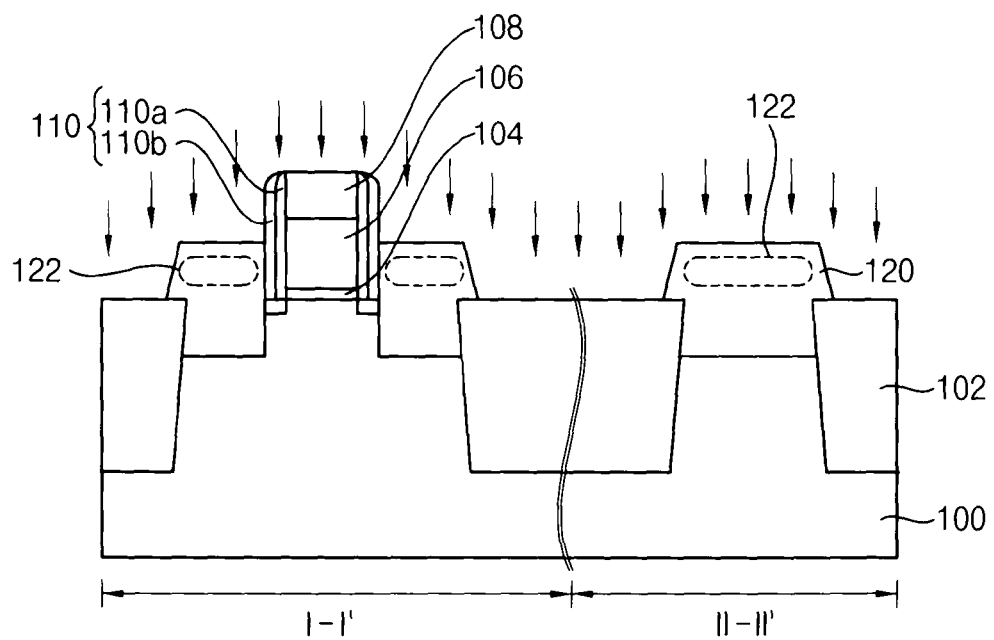

Referring to FIG. 4D, a highly doped impurity region 122 may be formed in each of the silicon patterns 120 by doping an N type impurity into a top surface of each of the silicon patterns 120. The highly doped impurity region 122 may be an elevated source/drain region. An impurity concentration of the highly doped impurity region 122 may be higher than that of the lowly doped impurity region.

The N type impurity is implanted from the top surfaces of the silicon patterns 120 and doped into the inside of the silicon patterns 120. However, because an area of the top surfaces of the silicon patterns 120 is increased and first and second angles R1 and R2 forming the side gradients of the silicon patterns 120 are high in the range of about 50° to about 85°, most N type impurities are implanted from the top surfaces to the inside of the silicon patterns 120, according to an example embodiment. That is, the N type impurity is rarely implanted into an inclined sidewall portion of each of the silicon patterns 120. For this reason, the highly doped impurity region 122 may have a uniform projected range.

Meanwhile, a lowly doped impurity region, which may be formed by previously doping impurity in-situ, is provided below the highly doped impurity region 122.

Figure 4E:
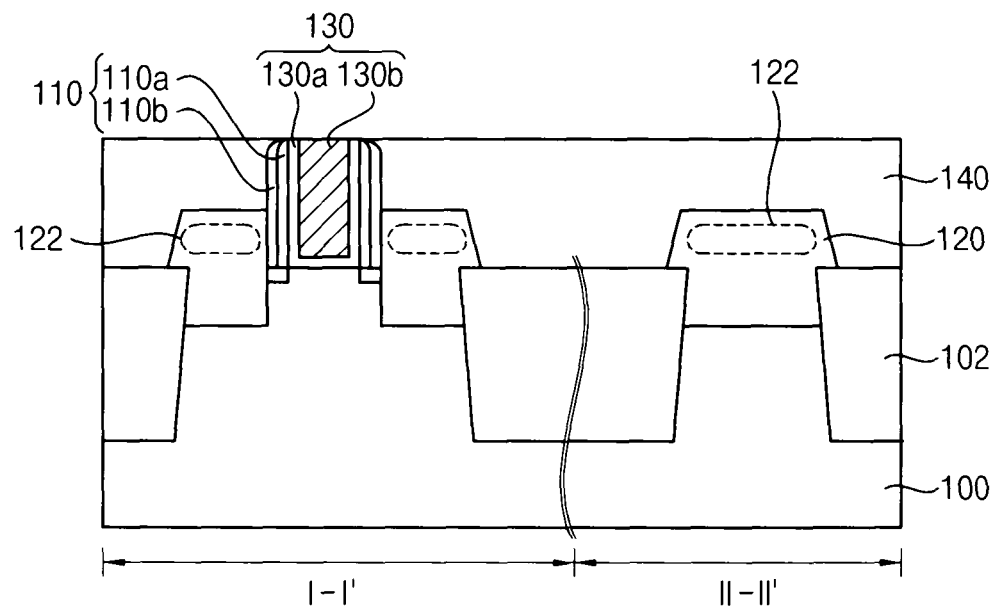

Referring to FIG. 4E, an insulating interlayer 140 covering a sacrificial gate structure may be formed on an entire surface of the silicon substrate 100 that includes silicon patterns 120 formed thereon. After that, the top surface of the sacrificial gate structure may be exposed by partially removing a top surface of the insulating interlayer 140 through a planarizing process.

A first opening is formed by removing the exposed sacrificial gate structure. A surface of the substrate is exposed to a bottom surface of the first opening. After that, a gate insulating layer 130a and a gate electrode 130b may be formed in the first opening. According to an example embodiment, gate insulating layer 130a may include metal oxide having high dielectric constant, and the gate electrode 130b may include a metal. Materials used for the gate insulating layer 130A may, in an example embodiment, include hafnium oxide, zirconium oxide, etc. The above materials may be used alone or in a combination thereof. According to an example embodiment, metallic materials used for the gate electrode 130b may include iridium (Ir), niobium (Nb), platinum (Pt), rhenium (Re), rhodium (Rh), ruthenium (Ru), tantalum (Ta), tantalum nitride (TaN), tantalum silicon nitride (TaSiN), titanium (Ti), titanium nitride (TiN), tungsten (W), vanadium (V), etc. The above materials may be used alone or in a combination thereof. However, the example embodiments are not limited thereto. For example, the metal directly making contact with the gate insulating layer 130a may include a metallic material having a work function of about 4.1 eV to about 4.4 eV.

The gate insulating layer 130a and the gate electrode 130b may be formed by forming a gate insulating layer and a gate electrode layer in the first opening and then polishing the gate electrode layer.

The NMOS transistor shown in FIG. 1 may be formed by performing the above processes. The NMOS transistor includes an elevated source/drain so that a short channel effect is reduced. Projected ranges of impurities constituting the elevated source/drain are uniform. Accordingly, a variation of a threshold voltage of the MOS transistor is reduced and the MOS transistor may exhibit superior electrical characteristics.

Figure 6A:
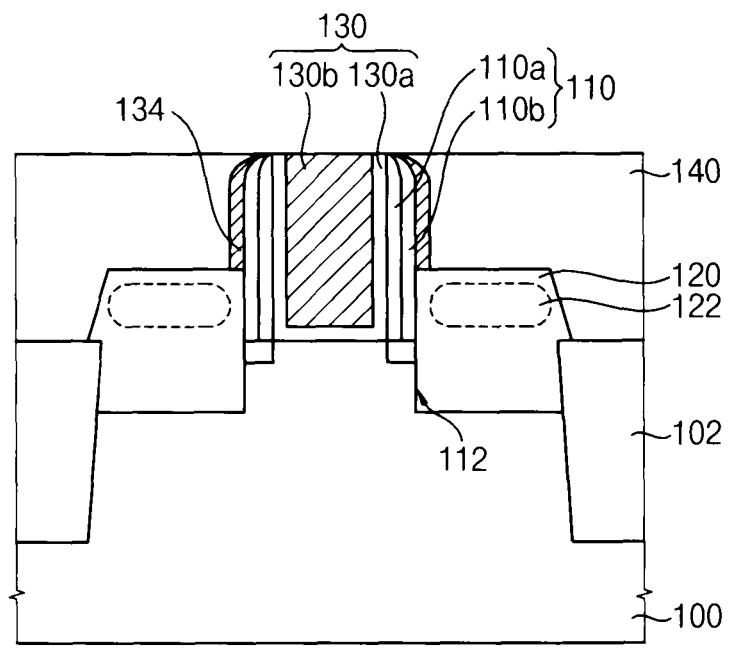
FIGS. 6A and 6B are sectional views illustrating an NMOS transistor in accordance with an example embodiment.
Figure 6B:
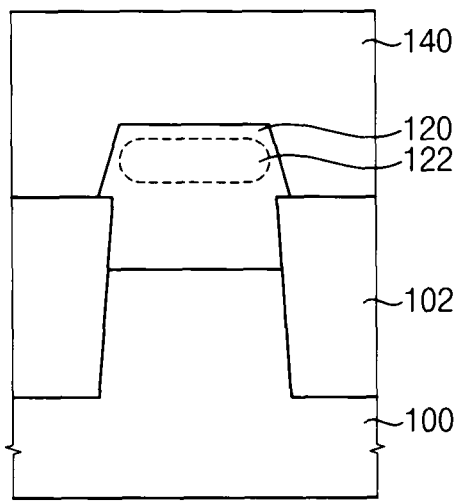

FIGS. 6A and 6B are sectional views illustrating an NMOS transistor in accordance with an example embodiment.

FIG. 6A is a sectional view taken along the first direction, and FIG. 6B is a sectional view taken along the second direction. The NMOS transistor of the example embodiment has a similar configuration as that of other example embodiments except that insulating wing spacers are further provided, for example.

Referring to FIGS. 6A and 6B, the NMOS transistor may be formed on a silicon substrate 100 that is divided into an active region and a field region, and includes a gate structure 130, gate spacers 110, insulating wing spacers 134, and silicon patterns 120 having a highly doped impurity region 122. The gate structure 130, the gate spacers 110, and the silicon patterns 120 having the highly doped impurity region 122 are similar to those described with reference to FIG. 1.

According to an example embodiment, the insulating wing spacers 134 are provided on sides of the gate spacers 110, and a bottom surface of the insulating wing spacers 134 makes contact with a top surface of each of the silicon patterns 120.

Although not shown, the silicon patterns 120 may not make contact with the gate spacers 110 so a valley or a gap may be formed there between. In this case, the insulating wing spacers 134 may have a shape that fills up the valley between one of the silicon patterns 120 and one of the gate spacers 110. The insulating wing spacers 134 may include an insulating material. According to an example embodiment, the insulating wing spacers 134 may include silicon oxide or silicon nitride.

The NMOS transistor of an example embodiment includes silicon patterns 120 having a similar shape as that of the NMOS transistor of other example embodiments. Accordingly, projected ranges of the impurities into the silicon patterns 120 are similar. As a result, a variation of a threshold voltage in the NMOS transistor is reduced and the NMOS transistor may exhibit superior electrical characteristics.

Figure 7A:
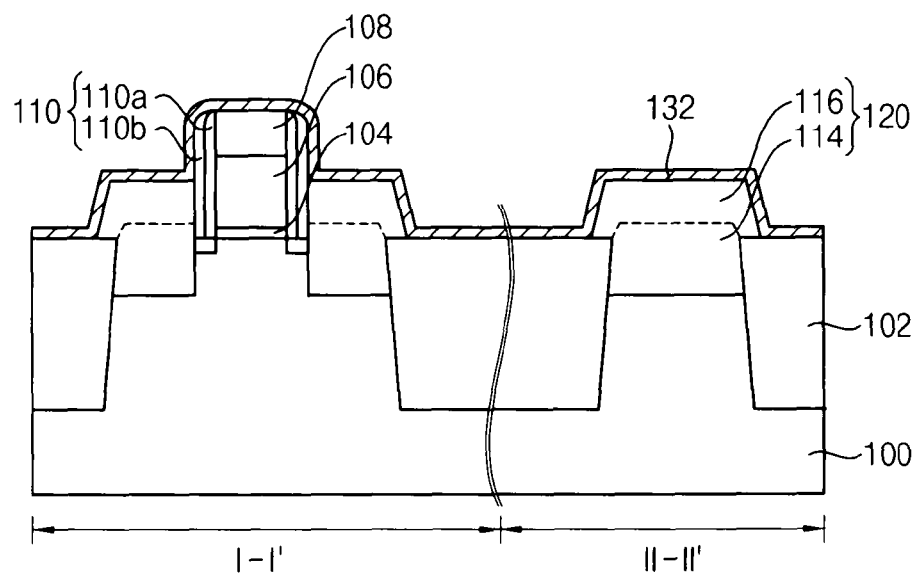
FIGS. 7A to 7C are sectional views illustrating a method of manufacturing an NMOS transistor shown in FIGS. 6A and 6B.
Figure 7B:
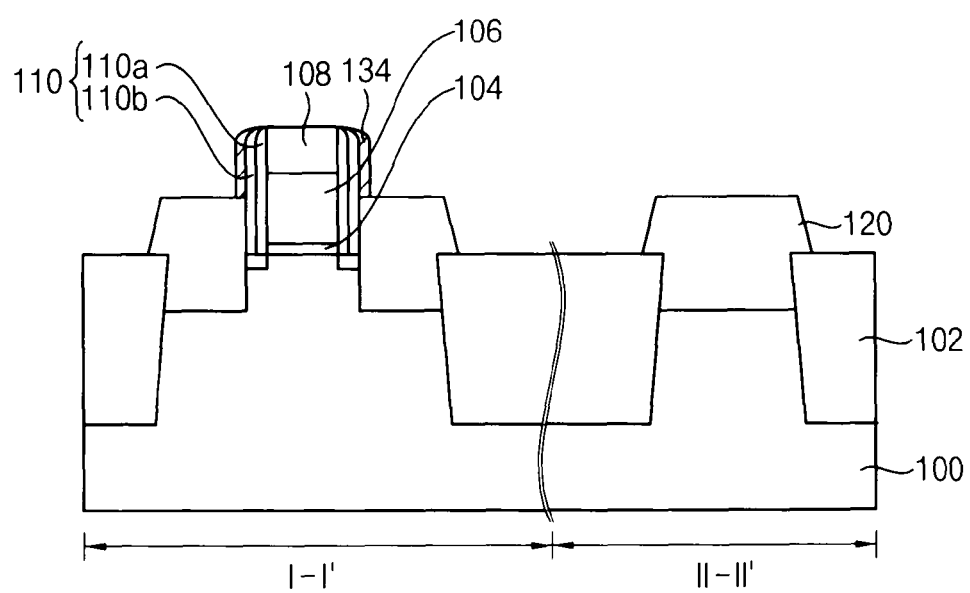
Figure 7C:
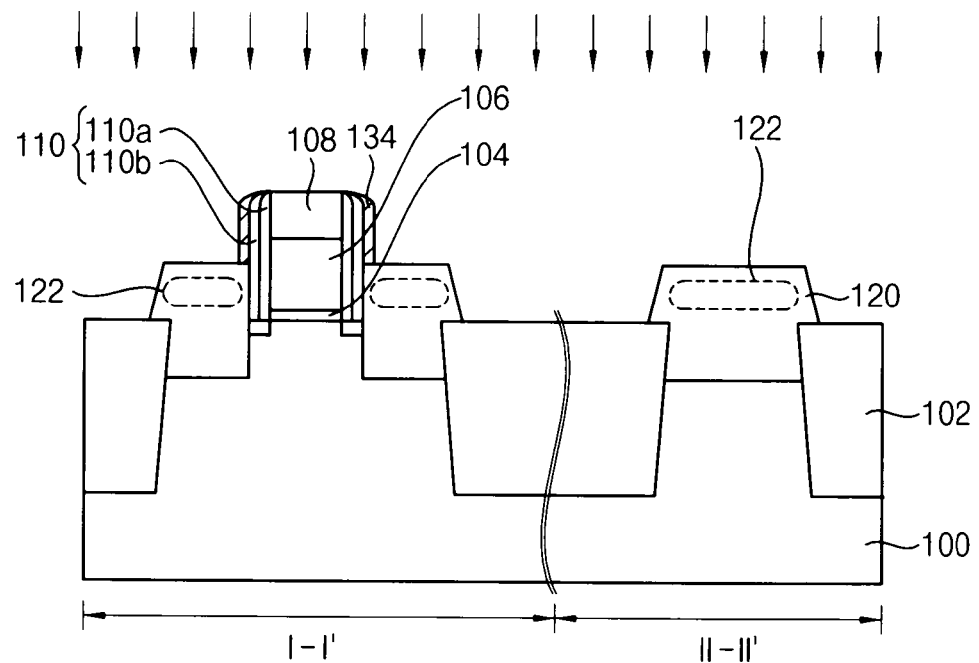

FIGS. 7A to 7C are sectional views illustrating a method of manufacturing an NMOS transistor shown in FIGS. 6A and 6B.

The NMOS transistor shown in FIGS. 6A and 6B may be manufactured by the same method as the manufacturing method of other example embodiments. The difference is that a process for forming insulating wing spacers is added.

First, a structure shown in FIG. 4C is formed by performing the process described with reference to FIG. 4A to 4C.

Referring to FIG. 7A, an insulating layer 132 for wing spacers is formed to cover top surfaces of the isolation layer pattern 102, the sacrificial gate structure, the silicon patterns 120, and the spacers 110. The insulating layer 132 for wing spacers is formed on surfaces of the sacrificial gate structure and the silicon patterns 120. If there is a valley between the sacrificial gate structure and one of the silicon patterns 120, the insulating layer 132 has a shape configured to fill up the valley. According to an example embodiment, the insulating layer 132 for wing spacers may include silicon oxide or silicon nitride.

Referring to FIG. 7B, insulating wing spacers 134 may be formed by anistropically etching the insulating layer 132 for wing spacers. Each of the insulating wing spacers 134 is provided on a side of each of the gate spacers 110 and a bottom surface of each of the insulating wing spacers 134 makes contact with a top surface of each of the silicon patterns 120.

Referring to FIG. 7C, a highly doped doping region is formed by implanting an N type impurity into a semiconductor pattern. As describe above, due to the insulating wing spacers, the valley between the sacrificial gate structure and each of the silicon patterns 120 is filled with the insulating wing spacer 134. Accordingly, impurities may not be abnormally and deeply doped through the valley between the sacrificial gate structure and each of the silicon patterns 120 during the impurity doing process. As a result, a highly doped impurity region having a uniform projected range may be formed.

After that, an NMOS transistor shown in FIGS. 6A and 6B may be prepared by performing the process the same as the process described with reference to FIG. 4E. The NMOS transistor includes an elevated source/drain so that a short channel effect is reduced. Projected ranges of impurities constituting the elevated source/drain are uniform. Accordingly, a variation of a threshold voltage of the NMOS transistor is reduced and the NMOS transistor may exhibit superior electrical characteristics.

Figure 8A:
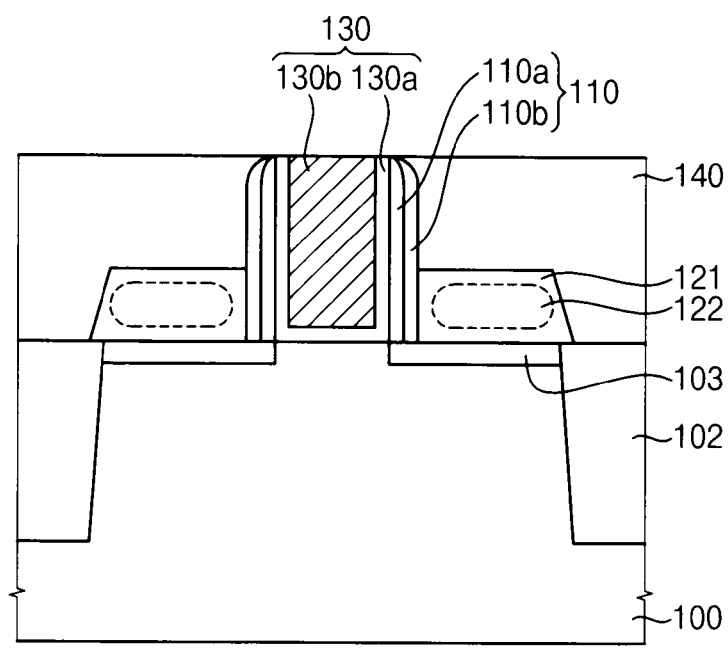
FIGS. 8A and 8B are sectional views illustrating an NMOS transistor in accordance with an example embodiment.
Figure 8B:
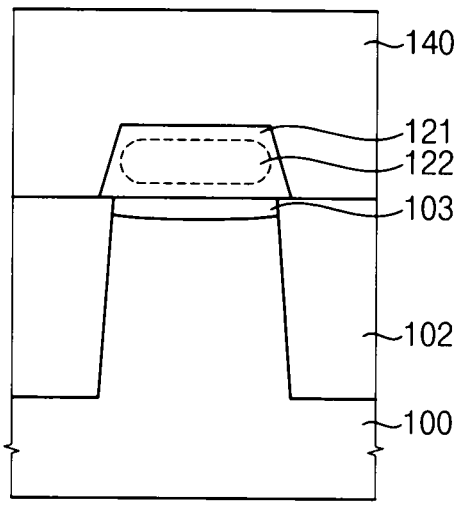

FIGS. 8A and 8B are sectional views illustrating an NMOS transistor in accordance with an example embodiment.

FIG. 8A is a sectional view taken along the first direction, and FIG. 8B is a sectional view taken along the second direction. The NMOS transistor of an example embodiment has a similar configuration as that of the NMOS transistor shown in FIG. 1 except that recessed portions is not provided on a substrate.

Referring to FIGS. 8A and 8B, the NMOS transistor may be formed on a silicon substrate 100 that is divided into an active region and a field region, and includes a gate structure 130, gate spacers 110 and silicon patterns 121 having a highly doped impurity region 122. The silicon patterns 121 are provided on a silicon substrate 100, which is a flat surface other than recessed portions. That is, a bottom surface of each of the silicon patterns 121 is provided on the same plane with the main surface portion of the silicon substrate 100. The highly doped impurity region 122 included in each of the silicon patterns 121 becomes an elevated source/drain region.

The silicon patterns 121 in accordance with an example embodiment have a similar shape as the second portion of the silicon patterns illustrated in FIG. 1. For example, a bottom surface of each of the silicon patterns 121 has a shape that laterally extends to a portion of the isolation layer pattern 102. According to an example embodiment, a bottom surface portion of each of the silicon patterns 121 making contact with a top surface of an outer peripheral portion of the isolation layer pattern 102 may have a size in the range of about 5 nm to about 15 nm. According to an example embodiment, a first angle between a first side and the main surface portion of the substrate 100 and a second angle between the second side and the main surface portion of the substrate 100 may be set in the range of about 50° to about 85°. A top surface of the silicon patterns 121 may be planar and substantially parallel to the main surface portion of the substrate 100. An upper width of the silicon patterns 121 may be equal to or greater than about 70% of a lower width of the silicon patterns.

A lowly doped impurity region 103 may be provided in the silicon substrate 100 under the silicon patterns 121 as the source/drain extension region.

A projected range of impurities into the silicon patterns is uniform in the MOS transistor. Accordingly, a variation of a threshold voltage of the NMOS transistor is reduced and the MOS transistor may exhibit superior electrical characteristics.

Figure 9A:
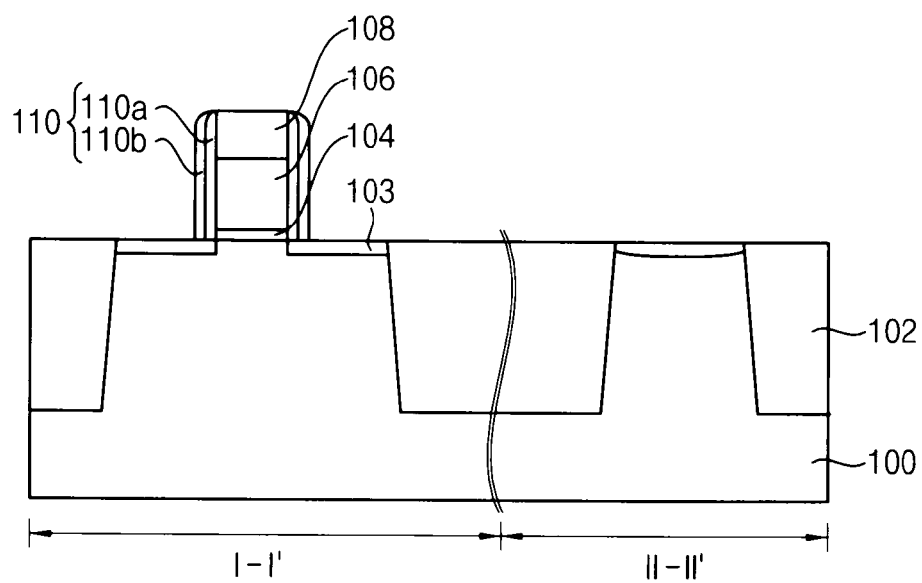
FIGS. 9A to 9C are sectional views illustrating a method of manufacturing an NMOS transistor shown in FIGS. 8A and 8B.
Figure 9B:
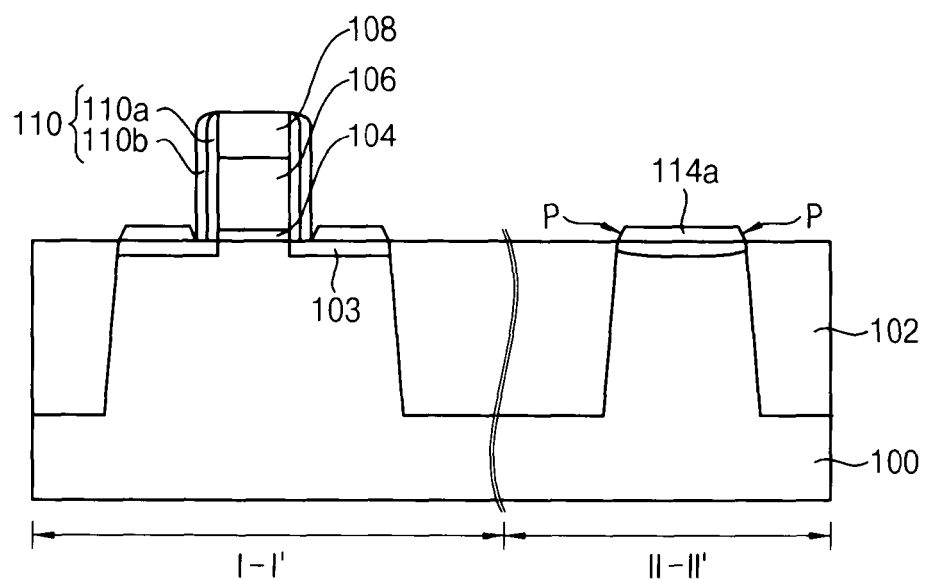
Figure 9C:
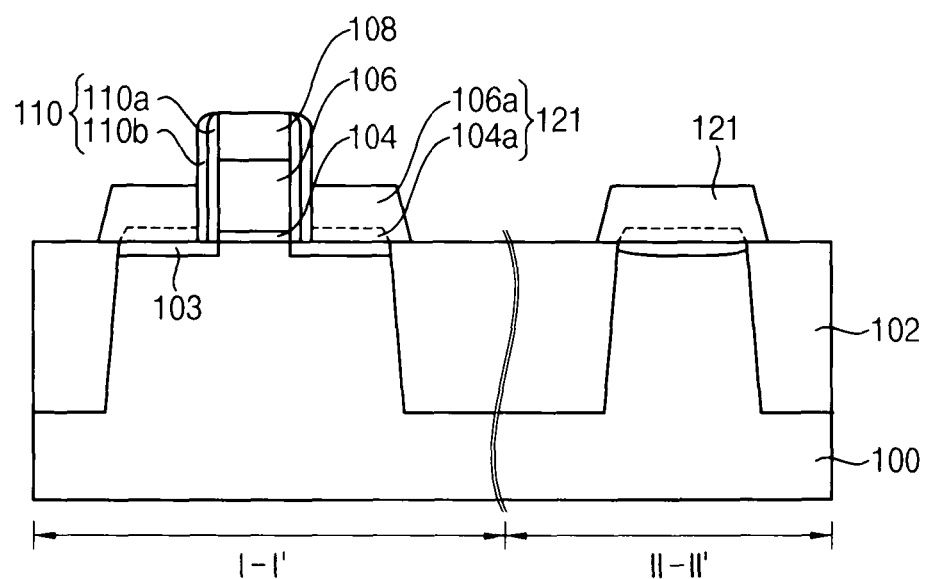

FIGS. 9A to 9C are sectional views illustrating a method of manufacturing an NMOS transistor shown in FIGS. 8A and 8B, according to an example embodiment.

Referring to FIG. 9A, isolation layer patterns 102 may be formed on a substrate corresponding to a field region by performing an isolation process on the silicon substrate 100. A sacrificial gate structure, which includes the sacrificial gate insulating layer 104 and the sacrificial gate electrode layer 106, may be formed on the silicon substrate 100 and gate spacers 110 may be formed on sidewalls of the sacrificial gate structure. The above processes are similar to those described with reference to FIG. 4A. A lowly doped impurity region may be formed by implanting a lowly doped N type impurity into the silicon substrate 100 onsides of the gate spacers. However, in an example embodiment, processes for forming recessed portions of sides of the gate spacers may be omitted.

Referring to FIG. 9B, a first preliminary silicon pattern 114a may be formed by performing the first selective epitaxial growth process. A facet P may be formed at an edge of a portion of the first preliminary silicon pattern 114a that is located higher than the main surface portion of the silicon substrate 100.

An N type impurity may be implanted in-situ by performing the first selective epitaxial growth process. The implanted N type impurity may be phosphorus (P), for example. According to an example embodiment, the phosphorus (P) may have an impurity concentration in the range of about $1E19\ cm^{-3}$ to about $9E19\ cm^{-3}$. It is preferable, in an example embodiment, that the phosphorus (P) have an impurity concentration of about $6E19\ cm^{-3}$. According to an example embodiment, a pressure in the process chamber may be in the range of about 10 Torr to about 70 Torr, and a process temperature may be about 700° C. or less when performing the first selective epitaxial growth process.

The first preliminary silicon patterns 114 may protrude from a silicon substrate to the extent that the facet P is formed at a side that is located higher than the main surface portion of the silicon substrate 100. Accord to an example embodiment, the first preliminary silicon patterns may have a height in the range of about 1 nm to about 10 nm.

Referring to FIG. 9C, a second preliminary silicon pattern 116 may be formed by performing a second selective epitaxial growth process on the first preliminary silicon patterns 114a. Accordingly, silicon patterns 121 including the first and second preliminary silicon patterns 104a and 106a may be prepared.

When the second selective epitaxial growth process is performed, an N type impurity is implanted with an impurity concentration that may be lower than the impurity concentration in the first selective epitaxial growth process. According to an example embodiment, the implanted N type impurity may be phosphorus (P). A pressure in the process chamber during the second selective epitaxial growth process may be higher than the pressure during the first selective epitaxial growth process, and the conditions for the second selective epitaxial growth process may be similar to the conditions described with reference to FIG. 4C.

After that, an NMOS transistor shown in FIGS. 8A and 8B may be prepared by performing the above processes described with reference to FIGS. 4D and 4E.

Accordingly, a variation of a threshold voltage of the MOS transistor may be reduced and the MOS transistor may exhibit superior electrical characteristics.

Figure 10:
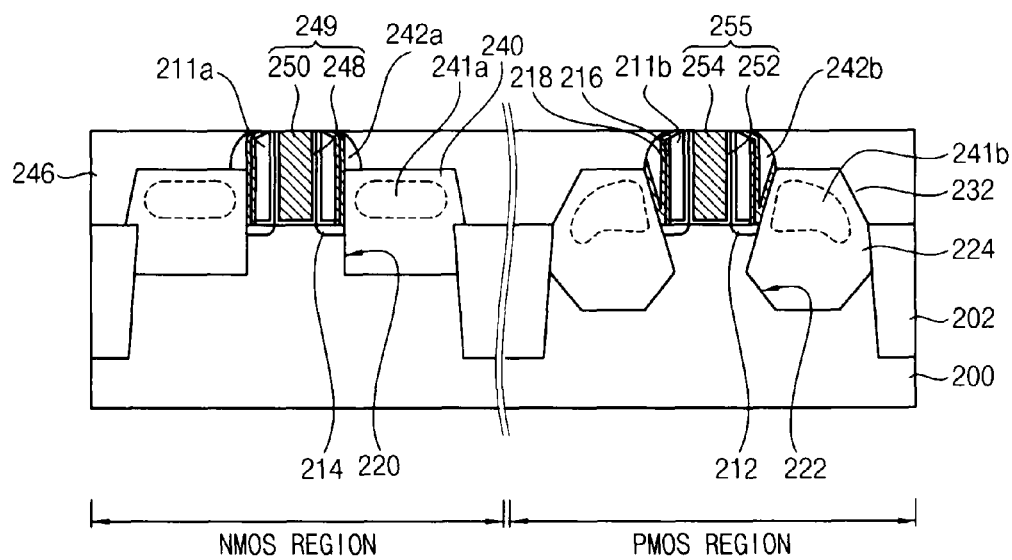

FIG. 10 is a sectional view illustrating a CMOS FET in accordance with an example embodiment.

Referring to FIG. 10, a silicon substrate 200 including an NMOS formation region and a PMOS formation region is prepared. An NMOS transistor is provided in the NMOS formation region and a PMOS transistor is provided in the PMOS formation region.

An NMOS transistor may be formed on a silicon substrate 200 divided into an active region and a field region. The NMOS transistor includes a first gate structure 249, first gate spacers 211a, silicon patterns having an N type highly doped impurity region 241a, and insulating wing spacers 242a. The silicon patterns 240 are provided on first recessed portions 220 and on the sides of the first gate spacers 211a. Each of the silicon patterns 240 has a first portion in one of the first recessed portions and a second portion protruding from a main surface portion of the silicon substrate 200. The N type highly doped impurity region 241a included in the silicon patterns 240 becomes an elevated source/drain region.

The PMOS transistor may include a second gate structure 255, second gate spacers 211b, silicon germanium patterns 224 having a P type highly doped impurity region 241b, and insulating wing spacers 242b. The silicon germanium patterns 224 are provided on second recessed portions 222 at sides of the second gate spacers 211 band protrude from a main surface portion of the silicon substrate 200. The silicon germanium patterns 224 may serve to improve mobility of a hole by applying stress to a channel region. The P type highly doped impurity region 241b included in each of the silicon germanium pattern 224 becomes an elevated source/drain region.

The NMOS transistor in accordance with an example embodiment may have a similar configuration as the NMOS transistor illustrated in FIGS. 6A and 6B. A bottom surface of the second portion of each of the silicon patterns in the NMOS transistor has a shape that laterally extends to a portion of the isolation layer pattern 202. A bottom surface portion of each of the silicon patterns 240 making contact with a top surface of an edge of the isolation layer pattern 202 may be in the range of about 5 nm to about 15 nm, according to an example embodiment. A first angle between a first side and the main surface portion of the substrate 200 and a second angle between a second side and the main surface portion of the substrate 200 may be in a range of about 50° to about 85°, according to an example embodiment. A top surface of each of the silicon patterns 240 has a plane substantially parallel to the main surface portion of the substrate 200. An upper width of each of the silicon patterns 240 may be equal to or greater than about 70% of a lower width of each the silicon patterns 240. The insulating wing spacers 242a are provided on sidewalls of the first gate spacers 211a, and a bottom surface of each insulating wing spacers 242a may contact a top surface of each of the silicon patterns 240.

Hereinafter, a PMOS FET will be described.

The second gate structure 255 has a stacked structure having a second gate insulating layer 252 and a second gate electrode 254. According to an example embodiment, the second gate insulating layer 252 may include a metal oxide layer having a high dielectric constant, and the second gate electrode 254 may include a metallic material. In an example embodiment, the second gate electrode 254 may include a metallic material different than a metallic material of the first gate electrode 250. The gate electrode 254 may include one metallic material or a structure on which at least two metallic materials are laminated, for example. A metallic material having a work function suitable for a PMOS transistor may be used in a portion of the second gate structure 255 that directly contacts the second insulating layer 252.

The second gate spacers 211b may be provided on both sidewalls of the second gate structure 255.

The silicon germanium patterns 224 protrude higher than the bottom surface of the second gate structure 255 while filling up the inside space of the second recessed portions 222 of the silicon substrate 200. Unlike the first recessed portions 220, the second recessed portions 222 may be sigma recesses having at least one of sidewalls of the shape of a sigma, according to an example embodiment.

A portion protruding higher than the bottom surface of the second gate structure 255 in each of the silicon germanium patterns 224 may include a facet P' having an angle with respect to a top flat surface of the silicon substrate 200. A valley may be formed between the facet P' of each of the silicon germanium patterns 224 and each of the second gate spacers 211b.

The insulating wing spacers 242b are provided on sidewalls of the second gate spacers 211b, and a bottom surface of each of insulating wing spacers 242b may make contact with a top surface of each of the silicon germanium patterns 224. The insulating wing spacers 242b are configured to fill up a portion between each of the silicon germanium patterns 224 and each of the second gate spacers 211b.

An insulating interlayer 246 may be provided to cover the second gate structure 255.

A variation of a threshold voltage in the CMOS FET in accordance with an example embodiment is reduced so that the CMOS FET can exhibit superior electrical characteristics.

FIGS. 11A to 11G are sectional views illustrating a method of manufacturing a CMOS FET shown in FIG. 10, according to an example embodiment.

Figure 11A:
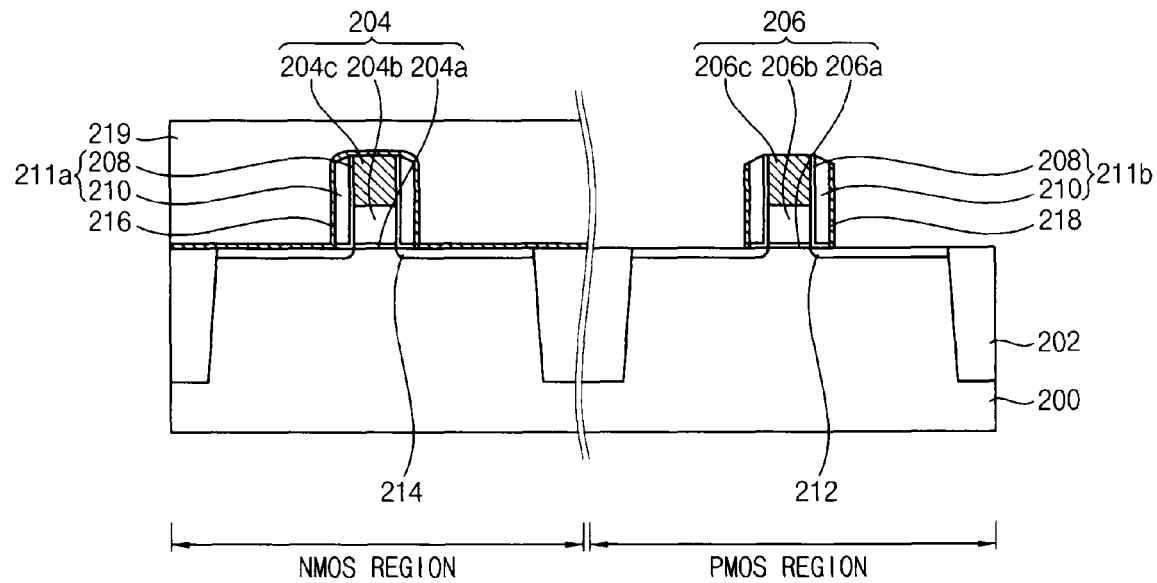

Referring to FIG. 11A, an isolation layer pattern 202 may be formed on a substrate corresponding to a field region by performing an isolation process on a silicon substrate 200.

A sacrificial gate insulating layer and a sacrificial gate electrode layer are formed on the silicon substrate 200. A hard mask pattern is formed on the sacrificial gate electrode layer. The sacrificial gate electrode layer and the sacrificial gate insulating layer are patterned using the hard mask pattern. Accordingly, sacrificial gate structures 204 and 206 where sacrificial gate insulating layers 204a and 206a, sacrificial gate electrodes 204b and 206b, and hard mask patterns 204c and 206c are laminated is formed. That is, a first sacrificial gate structure 204 is formed in an NMOS region of the silicon substrate 200, and a second sacrificial gate structure 206 is formed in a PMOS region of the silicon substrate 200.

A first spacer layer 208 may be formed along surfaces of the first and second sacrificial gate structures 204 and 206 and a surface of the silicon substrate 200. A first source/drain extension region 214 may be formed under a surface of the substrate 200 on both sides of the first sacrificial gate structure 204 by doping an N type impurity. A second source/drain extension region 212 may be formed under a surface of the substrate 200 on both sides of the second sacrificial gate structure 206 by doping a P type impurity.

Subsequently, a second spacer layer 210 may be formed on the first spacer layer, and the first and second spacer layers 208, 210 may be anisotropically etched. Accordingly, a first gate spacers 211a are formed on sidewalls of the first sacrificial gate structure 204, and a second gate spacers 211b are formed on sidewalls of the second sacrificial gate structure 206.

A first blocking insulating layer 216 is formed along the first and second sacrificial gate structures 204 and 206, first and second gate spacers 211a and 211b, and a silicon substrate 200. A first photoresist pattern 219 covering an entire NMOS region may be formed by performing a photo process. After that, a first blocking insulating layer pattern 216 is formed by removing a first blocking insulating layer of the PMOS region exposed through etching.

A first blocking insulating layer pattern 216 is formed in the NMOS region. The first blocking insulating layer pattern 216 may be provided as a mask such that an epitaxial layer is selectively grown in only a PMOS region.

Figure 11B:
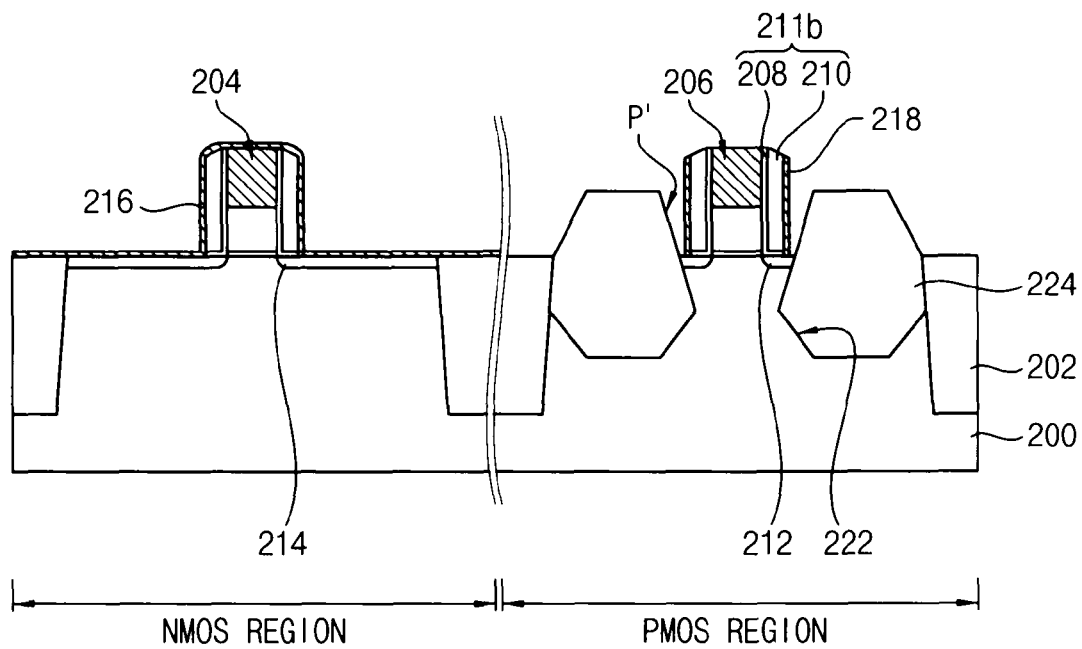

Referring to FIG. 11B, a second recessed portions 222 may be formed by etching a surface of a silicon substrate 200 of both sides of the second gate spacers 211b of the PMOS region.

After that, a silicon germanium pattern 224 fills up the inside of the second recessed portions 222 and protrudes higher than a top surface of the silicon substrate 200.

The silicon germanium patterns 224 may be formed through a selective epitaxial growth process. An impurity region may be formed by implanting a P type impurity in-situ through the selective epitaxial growth process.

The epitaxial layer may be grown only on a portion of the exposed silicon substrate 200 by performing the selective epitaxial process. Accordingly, silicon germanium patterns 224 are not formed in the NMOS region covered with the first blocking insulating layer pattern 216.

Figure 11C:
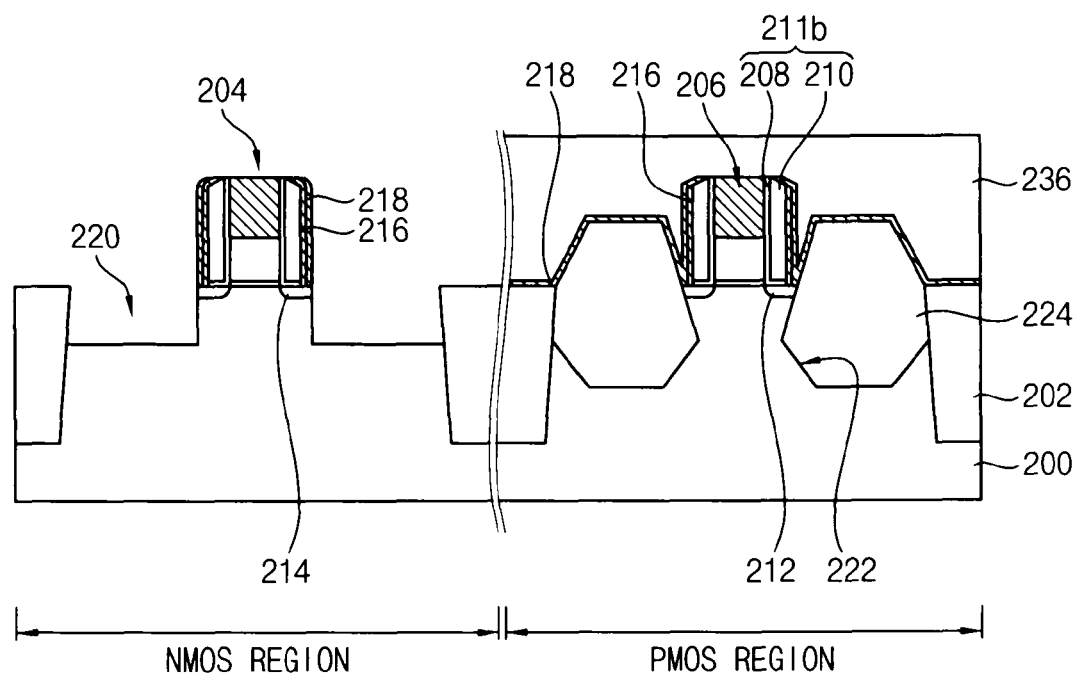
Figure 11D:
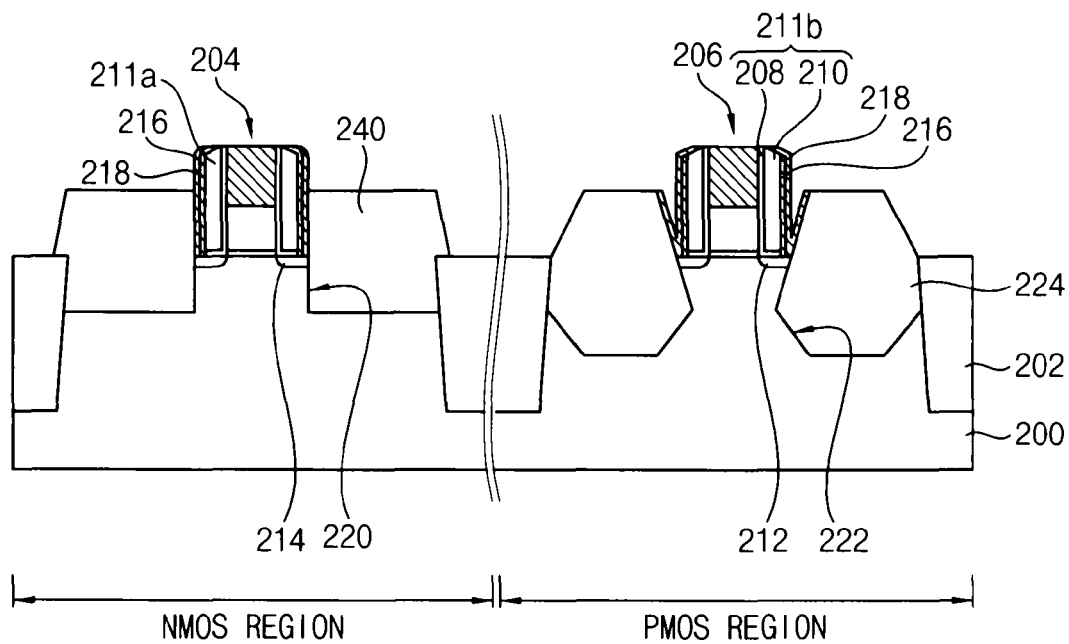

Referring to FIG. 11C, a second blocking insulating layer 218 is formed along surfaces of the first blocking insulating layer pattern 216, the silicon germanium pattern 224, and the second sacrificial gate structure 206. In an example embodiment, the second blocking insulating layer 218 may have a thickness in the range of about 10 Å to about 30 Å.

The second blocking insulating layer 218 may, in an example embodiment, be formed by the same material as that of the first blocking insulating layer pattern 216. In an example embodiment, the second blocking insulating layer 218 may be formed by silicon nitride.

A second photoresist pattern 236 covering an entire PMOS region is formed by performing a photo process on the second blocking insulating layer. After that, the first source/drain extension region 214 and the first blocking insulating layer pattern 216 of the NMOS region are etched through an anisotropic etching process.

Subsequently, first recessed portions 220 are formed by etching a surface of a substrate located on sides of first gate spacers of the NMOS region.

Silicon patterns 240 fill up the inside of the recessed portions 220 and protrude higher than a bottom surface of the first sacrificial gate structure 204.

A process of forming the silicon patterns 240 is substantially the same as that described with reference to FIGS. 4B and 4C. Accordingly, the silicon patterns having a shape as illustrated in FIG. 5 may be formed.

Figure 11E:
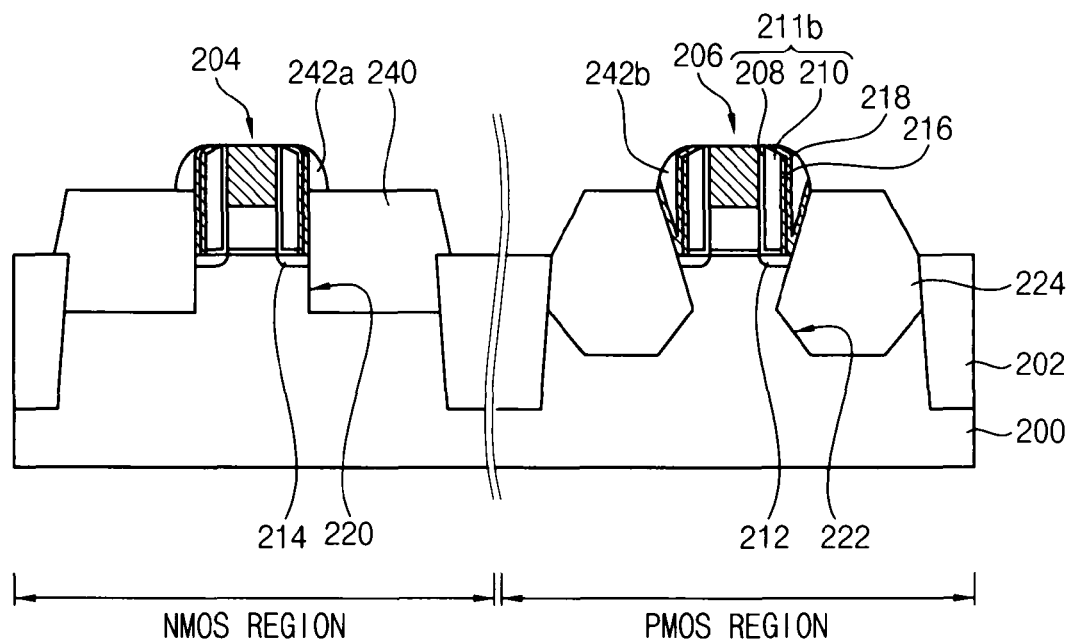

Referring to FIG. 11E, an insulating wing spacer layer is formed on the silicon patterns 240, silicon germanium patterns 224, first and second gate spacers 211*a*, 211*b*, and the first and second sacrificial gate structures 204 and 206.

The insulating wing spacer layer has a thickness sufficient to fill up portions between each of the silicon germanium patterns 224 and each of the second gate spacers 211*b*, and portions between each of the silicon patterns 240 and each of the first gate spacers 211*a*.

Insulating wing spacers 242*a* and 242*b* may be formed on sidewalls of the first and second sacrificial gate structures 204 and 206, respectively, by anistropically etching the insulating wing spacer layer.

Figure 11F:
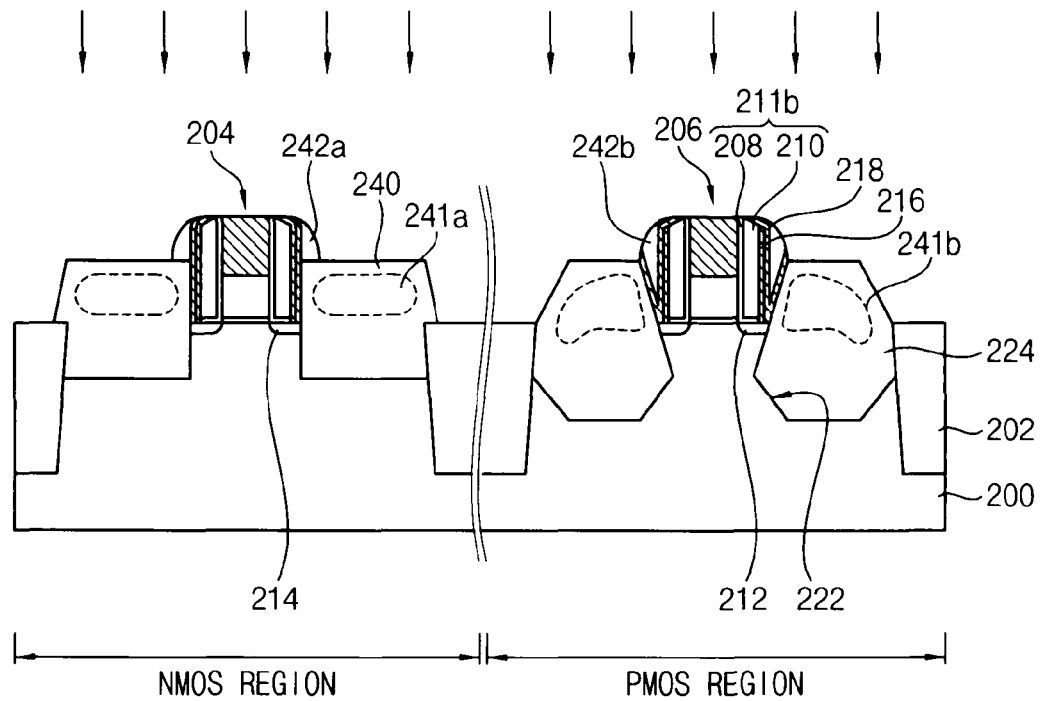

Referring to FIG. 11F, the P type highly doped impurity region 241*b* may be formed by additionally doping a P type impurity into the silicon germanium patterns 224 of the PMOS region. The N type highly doped impurity region 241*a* may be formed by additionally doping an N type impurity into the silicon germanium patterns 224 of the NMOS region.

Through the above processes, elevated sources/drains of the NMOS transistor and the PMOS transistor are formed, respectively.

Figure 11G:
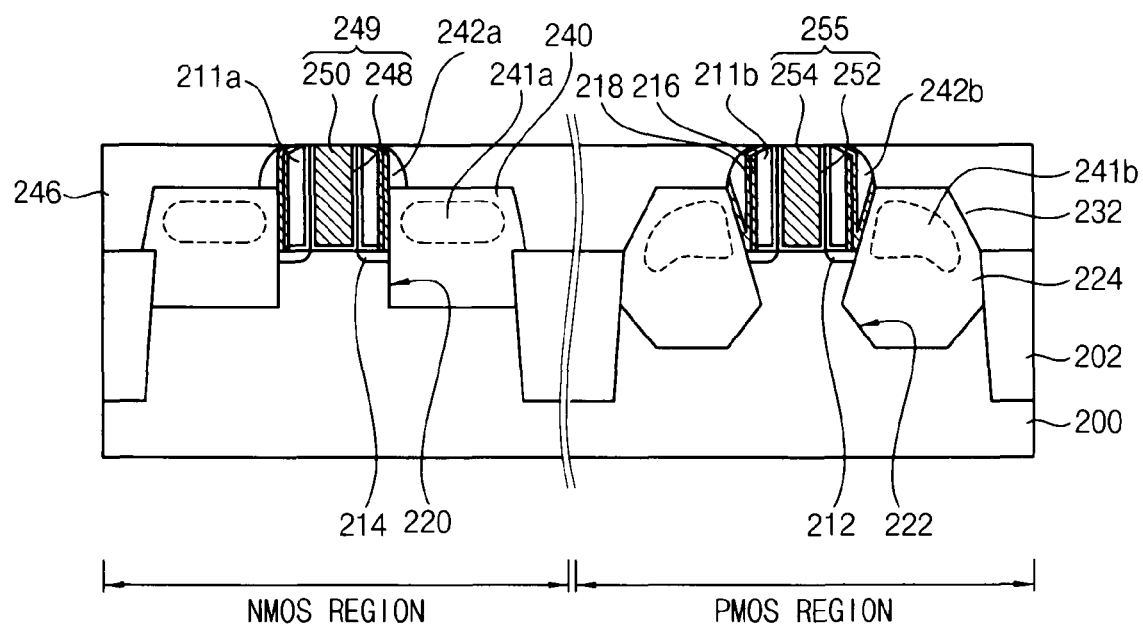

Referring to FIG. 11G, an insulating interlayer 246 covering the first and second sacrificial gate structures 204 and 206 is formed. After that, top surfaces of the first and second sacrificial gate electrodes 250, 254 may be exposed by removing the insulating interlayer through a planarizing process.

A first opening may be formed by removing the first sacrificial gate electrode 204*b* and the first sacrificial gate insulating layer 204*a*. A first gate insulating layer 248 and a first gate electrode 250 may be formed in the first opening. In an example embodiment, the first gate insulating layer 248 may include metal oxide having high dielectric constant, and the gate electrode 250 may include a metal.

A second opening may be formed by removing the second sacrificial gate electrode 206*b* and the second gate insulating layer 206*a*. A second gate insulating layer 252 and a second gate electrode 254 may be formed in the second opening. In an example embodiment, the second gate insulating layer 252 may include metal oxide having high dielectric constant, and the second gate electrode 254 may include a metal. The first and second gate electrodes 250 and 254 may include different metallic materials, respectively. A CMOS FET, in which a variation of a threshold voltage is rarely generated, may be manufactured by performing the above processes.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

In accordance with the example embodiments, the transistors having high integration and high performance can be provided. The transistors are applicable to various semiconductor memories or logic devices.

While example embodiments have been particularly shown and described, it will be understood by one of ordinary skill in the art that variations in form and detail may be made therein without departing from the spirit and scope of the claims.

What is claimed is:

1. A semiconductor device, comprising:
   a silicon substrate including an isolation region and an active region, the active region having a main surface portion and recessed portions;
   a gate structure on the active region of the silicon substrate, the gate structure including a gate insulating layer and a gate electrode, the gate structure being between the recessed portions;
   spacers on both sides of the gate structure;
   silicon patterns on the recessed portions of the active region and on sides of the spacers, each of the silicon patterns including a first portion in one of the recessed portions and a second portion disposed higher than a bottom surface of the gate structure, a lower edge of the second portion configured to partially contact a top surface of the isolation region, a first side and a second side of each of the silicon patterns being inclined toward an inside of the active region in an upward direction, the first side and the second side being opposite to each other in a channel width direction of the gate structure; and
   highly doped impurity regions in the silicon patterns with an N type impurity,
   wherein a lower edge of the second portion is configured to partially cover a top surface of the isolation region.

2. The semiconductor device of claim 1, wherein a portion of the lower edge of the second portion of the silicon patterns, which contact the top surface of the isolation region, has a width in a range of about 5 nm to about 15 nm.

3. The semiconductor device of claim 1, wherein a first angle between the first side and a top flat surface of the silicon substrate and a second angle between the second side and the top flat surface of the silicon substrate are in a range of about 50° to about 85°.

4. The semiconductor device of claim 1, wherein a top surface of each of the silicon patterns is flat, and an upper width of each of the silicon patterns is equal to or greater than about 70% of an upper width of the first portion of each of the silicon patterns located in the recessed portions.

5. The semiconductor device of claim 1, further comprising:
   wing spacers configured to contact a top surface of each of the silicon patterns, the wing spacers disposed on a sidewall of the spacers.

6. A semiconductor device, comprising:
   a silicon substrate including an isolation region and an active region, the active region including a main surface portion and at least one recessed portion;
   a gate structure on the active region of the silicon substrate, the gate structure including a gate insulating layer and a gate electrode;
   a spacer on at least one side of the gate structure;
   a silicon pattern on the at least one recessed portion of the active region and on a side of the spacer, the silicon pattern including a first portion in the at least one recessed portion and a second portion disposed higher than a bottom surface of the gate structure; and
   a highly doped impurity region in the silicon pattern, wherein a lower edge of the second portion is configured to partially cover a top surface of the isolation region.

7. The semiconductor device of claim 6, wherein a lower edge of the second portion is configured to partially contact a top surface of the isolation region.

8. The semiconductor device of claim 6, wherein
the silicon pattern includes a first side and a second side opposite to each other in a channel width direction of the gate structure; and
the first side and the second side are inclined toward an inside of the active region in an upward direction.

9. The semiconductor device of claim 6, wherein the highly doped impurity region in the silicon pattern includes an N type impurity.

10. The semiconductor device of claim 9, further comprising:
a second active region in the silicon substrate, the second active region including a second at least one recessed portion;
a second gate structure on the second active region of the silicon substrate, the second gate structure including a second gate insulating layer and a second gate electrode;
a second spacer on at least one side of the second gate structure;
a second silicon pattern on the second at least one recessed portion of the second active region and on a side of the second spacer, the second silicon pattern including a first portion in the second at least one recessed portion and a second portion disposed higher than a bottom surface of the gate structure; and
a second highly doped impurity region in the second silicon pattern, the second highly doped impurity region in the second silicon pattern including a P type impurity.

11. The semiconductor device of claim 6, wherein the spacer includes a first layer and a second layer, the first and the second layers being on a side of the gate structure.

12. The semiconductor device of claim 6, wherein
the silicon pattern includes a first side and a second side opposite to each other in a channel width direction of the gate structure; and
a first angle between the first side and a top flat surface of the silicon substrate and a second angle between the second side and the top flat surface of the silicon, substrate are in a range of about 50° to about 85°.

13. The semiconductor device of claim 6, wherein the highly doped impurity region is enclosed by the silicon pattern.

* * * * *